(12) United States Patent
Bakker et al.

(10) Patent No.: US 7,868,304 B2
(45) Date of Patent: Jan. 11, 2011

(54) METHOD FOR REMOVAL OF DEPOSITION ON AN OPTICAL ELEMENT, LITHOGRAPHIC APPARATUS, DEVICE MANUFACTURING METHOD, AND DEVICE MANUFACTURED THEREBY

(75) Inventors: Levinus Pieter Bakker, Helmond (NL); Vadim Yevgenyevich Banine, Helmond (NL); Johannes Hubertus Josephina Moors, Helmond (NL); Carolus Ida Maria Antonius Spee, Helmond (NL); Johannes Christiaan Leonardus Franken, Knegsel (NL); Arnoud Cornelis Wassink, Veldhoven (NL); Paul Peter Anna Antonius Brom, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1135 days.

(21) Appl. No.: 11/051,477

(22) Filed: Feb. 7, 2005

(65) Prior Publication Data
US 2006/0175558 A1    Aug. 10, 2006

(51) Int. Cl.
*A61N 5/00*    (2006.01)
(52) U.S. Cl. .............. 250/492.2; 250/492.1; 250/504 R
(58) Field of Classification Search ... 250/492.1–492.3, 250/493.1–504 H
See application file for complete search history.

(56) References Cited

U.S. PATENT DOCUMENTS

| 6,241,477 | B1 * | 6/2001 | Brezoczky et al. ............. 417/48 |
| 6,359,969 | B1 | 3/2002 | Shmaenok ................... 378/156 |
| 6,503,819 | B2 * | 1/2003 | Tanabe et al. ............... 438/591 |
| 6,576,912 | B2 | 6/2003 | Visser et al. ............. 250/492.2 |
| 6,614,505 | B2 | 9/2003 | Koster et al. ................... 355/30 |
| 6,621,848 | B1 * | 9/2003 | Ullman et al. ................ 372/89 |
| 6,650,681 | B1 * | 11/2003 | Ullman et al. ................ 372/89 |
| 6,704,340 | B2 * | 3/2004 | Ershov et al. ................. 372/58 |
| 6,753,941 | B2 | 6/2004 | Visser ......................... 355/30 |
| 6,770,424 | B2 * | 8/2004 | Mandal et al. ............. 430/311 |
| 6,770,895 | B2 * | 8/2004 | Roux ...................... 250/492.2 |
| 6,803,605 | B2 * | 10/2004 | Lindstrom et al. ............ 257/94 |
| 6,838,684 | B2 * | 1/2005 | Bakker et al. ............ 250/492.2 |
| 6,914,919 | B2 * | 7/2005 | Watson et al. ................. 372/25 |
| 6,972,421 | B2 * | 12/2005 | Melnychuk et al. ..... 250/504 R |

(Continued)

FOREIGN PATENT DOCUMENTS

WO    WO 2004/104707 A2    12/2004

(Continued)

*Primary Examiner*—Jack I Berman
*Assistant Examiner*—Andrew Smyth
(74) *Attorney, Agent, or Firm*—Pillsbury Winthrop Shaw Pittman LLP

(57) ABSTRACT

A method for removal of deposition on a radiation collector of a lithographic apparatus includes providing a gas barrier to an end of a radiation collector, thereby providing a radiation collector enclosure volume; providing a gas to the enclosure volume, the gas selected from a halogen containing gas and a hydrogen containing gas; and removing at least part of the deposition from the radiation collector. A lithographic apparatus includes a radiation collector; a circumferential hull enclosing the radiation collector; a gas barrier at an end of the radiation collector, thereby providing a radiation collector enclosure volume. The radiation collector is enclosed by the circumferential hull and the gas barrier. An inlet provides a gas to the radiation collector enclosure volume and an outlet removes a gas from the radiation collector enclosure volume.

30 Claims, 7 Drawing Sheets

U.S. PATENT DOCUMENTS

| | | | |
|---|---|---|---|
| 7,050,149 B2 * | 5/2006 | Owa et al. | 355/30 |
| 7,057,190 B2 * | 6/2006 | Bakker et al. | 250/492.2 |
| 7,116,394 B2 * | 10/2006 | Bakker et al. | 355/30 |
| 7,211,810 B2 * | 5/2007 | Bakker et al. | 250/492.1 |
| 7,355,672 B2 * | 4/2008 | Van Herpen et al. | 355/30 |
| 7,377,978 B2 * | 5/2008 | Nishizawa | 117/88 |
| 2003/0037802 A1 * | 2/2003 | Nakahara et al. | 134/1.1 |
| 2003/0047739 A1 * | 3/2003 | Lindstrom et al. | 257/79 |
| 2003/0051665 A1 * | 3/2003 | Zhao et al. | 118/723 E |
| 2003/0095623 A1 | 5/2003 | Singer et al. | 378/34 |
| 2004/0006249 A1 * | 1/2004 | Hoshino et al. | 570/123 |
| 2004/0018727 A1 * | 1/2004 | Yokogawa et al. | 438/689 |
| 2004/0033425 A1 * | 2/2004 | Koops et al. | 430/5 |
| 2004/0094724 A1 | 5/2004 | Schuurmans et al. | 250/492.2 |
| 2004/0108465 A1 * | 6/2004 | Bakker et al. | 250/492.1 |
| 2004/0218157 A1 * | 11/2004 | Bakker et al. | 355/30 |
| 2005/0104015 A1 * | 5/2005 | Wedowski et al. | 250/504 R |
| 2006/0072084 A1 * | 4/2006 | Van Herpen et al. | 355/30 |
| 2006/0091109 A1 * | 5/2006 | Partlo et al. | 216/63 |
| 2006/0138354 A1 * | 6/2006 | Bakker et al. | 250/492.21 |
| 2006/0201413 A1 * | 9/2006 | Nishizawa | 117/84 |

FOREIGN PATENT DOCUMENTS

| | | | |
|---|---|---|---|
| WO | WO 2004/104707 A3 | 12/2004 | |

* cited by examiner

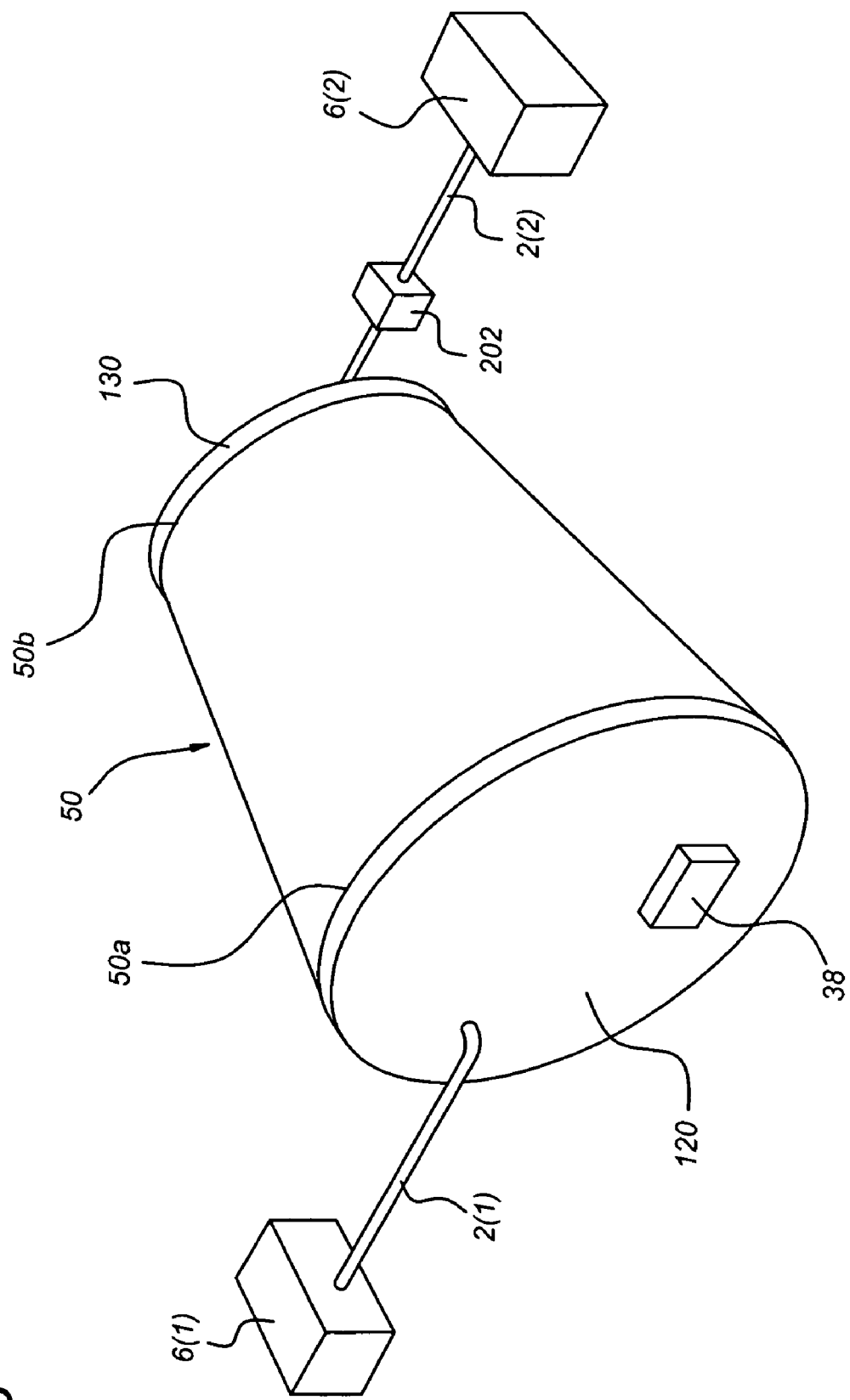

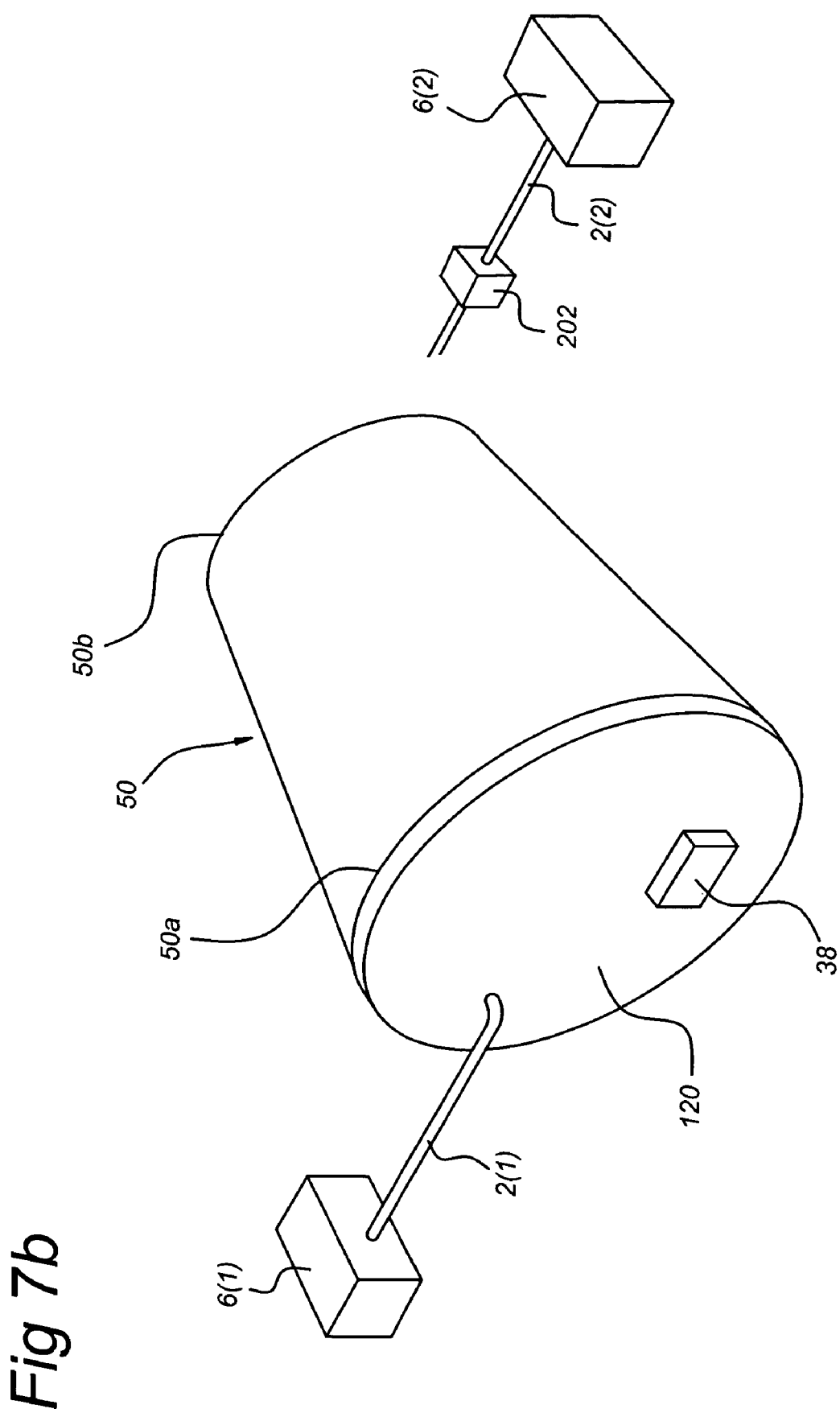

METHOD FOR REMOVAL OF DEPOSITION ON AN OPTICAL ELEMENT, LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates to a method for the removal of deposition on an optical element, a lithographic apparatus, a device manufacturing method, and a device manufactured thereby.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources include, for example, laser-produced plasma sources, discharge plasma sources, or synchrotron radiation from electron storage rings.

The source of EUV radiation is typically a plasma source, for example a laser-produced plasma or a discharge source. A common feature of any plasma source is the production of fast ions and atoms, which are expelled from the plasma in all directions. These particles can be damaging to the collector and condenser mirrors which are generally multilayer mirrors or grazing incidence mirrors, with fragile surfaces. This surface is gradually degraded due to the impact, or sputtering, of the particles expelled from the plasma and the lifetime of the mirrors is thus decreased. The sputtering effect is particularly problematic for the radiation collector. The purpose of this mirror is to collect radiation which is emitted in all directions by the plasma source and direct it towards other mirrors in the illumination system. The radiation collector is positioned very close to, and in line-of-sight with, the plasma source and therefore receives a large flux of fast particles from the plasma. Other mirrors in the system are generally damaged to a lesser degree by sputtering of particles expelled from the plasma since they may be shielded to some extent.

In the near future, extreme ultraviolet (EUV) sources will probably use tin or another metal vapor to produce EUV radiation. This tin may leak into the lithographic apparatus, and will be deposited on mirrors in the lithographic apparatus, e.g. the mirrors of the radiation collector. The mirrors of such a radiation collector may have a EUV reflecting top layer of, for example, ruthenium (Ru). Deposition of more than approximately 10 nm tin (Sn) on the reflecting Ru layer will reflect EUV radiation in the same way as bulk Sn. It is envisaged that a layer of a few nm Sn is deposited very quickly near a Sn-based EUV source. The overall transmission of the collector will decrease significantly, since the reflection coefficient of tin is much lower than the reflection coefficient of ruthenium. In order to prevent debris from the source or secondary particles generated by this debris from depositing on the radiation collector, U.S. Pat. No. 6,753,941 discloses a so called lamellar contaminant barrier, which includes at least two sets of channels arranged substantially parallel to the direction of propagation of the beam of radiation, which sets are spaced apart from each other along an optical axis of the beam of radiation, and a supply of flushing gas to the space between the two sets of channels. Though such traps may remove part of the debris, still some debris will deposit on the radiation collector.

SUMMARY OF THE INVENTION

It is an aspect of the present invention to provide a method for the removal of deposition on a radiation collector of a lithographic apparatus. It is further aspect of the present invention to provide a device manufacturing method and a device manufactured thereby. It is yet another aspect of the present invention to provide a lithographic apparatus.

According to an aspect of the present invention, a method for the removal of a deposition on a radiation collector of a lithographic apparatus includes providing a gas barriers to an end of the radiation collector, thereby providing a radiation collector enclosure volume; providing a gas to the radiation collector enclosure volume, the gas selected from one or more of the group of a halogen containing gas and a hydrogen containing gas; and removing at least part of the deposition from the radiation collector.

According to another aspect of the present invention, a device manufacturing method includes providing a lithographic apparatus including a radiation collector; projecting a patterned beam of radiation onto a target portion of the substrate; during or after use of the apparatus, removing at least part of a deposition from the radiation collector in a removal process including providing a gas barrier to an end of the radiation collector, thereby providing a radiation collector enclosure volume; providing a gas to the radiation collector enclosure volume, the gas selected from one or more of the group of a halogen containing gas and a hydrogen containing gas; and removing at least part of the deposition from the radiation collector.

According to another aspect of the present invention, a lithographic apparatus includes a radiation collector; a gas barrier an end of the radiation collector, thereby providing a radiation collector enclosure volume; an inlet to provide a gas to the enclosure volume; and an outlet to remove a gas from the radiation collector enclosure volume.

According to another aspect of the present invention, a lithographic apparatus include a radiation collector; a circumferential hull enclosing the radiation collector; a gas barrier at an end of the radiation collector, thereby providing a radiation collector enclosure volume wherein the radiation collector is enclosed by the circumferential hull and the gas barrier; an inlet to provide a gas to the radiation collector enclosure volume; and an outlet to remove a gas from the radiation collector enclosure volume.

BRIEF DESCRIPTION OF THE DRAWINGS

Embodiments of the present invention will now be described, by way of example only, with reference to the accompanying schematic drawings in which corresponding reference symbols indicate corresponding parts, and in which:

FIGS. 7a and 7b schematically depict one or two shutters enclosing the radiation collector according to embodiments of the present invention;

DETAILED DESCRIPTION

Figure 1:
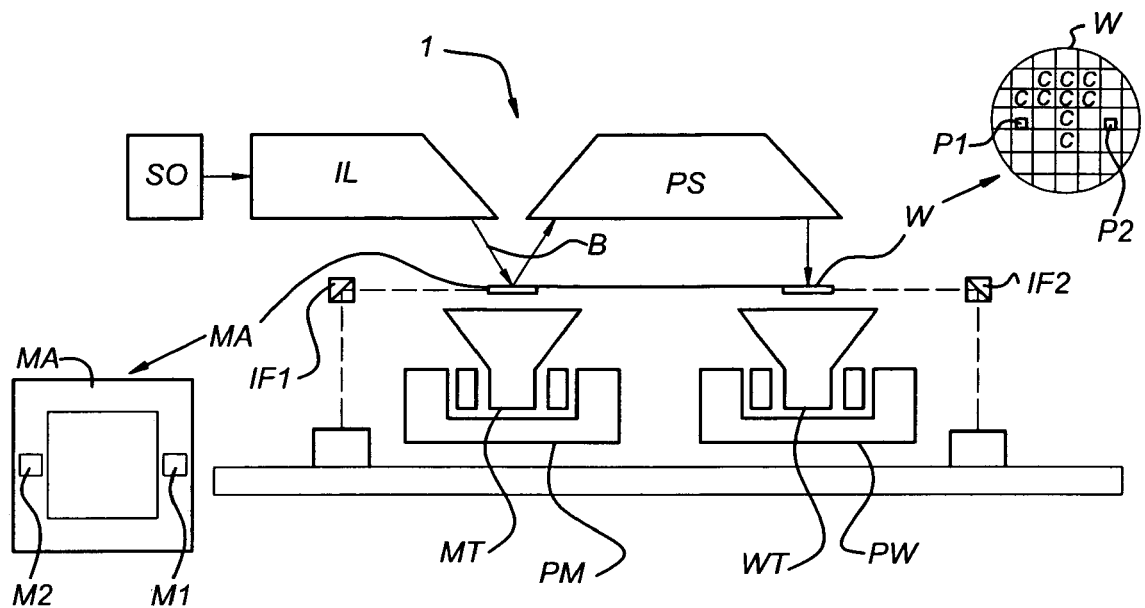
FIG. 1 schematically depicts a lithographic apparatus according to an embodiment of the present invention.

FIG. 1 schematically depicts a lithographic apparatus 1 according to an embodiment of the present invention. The apparatus 1 includes an illumination system (illuminator) IL configured to condition a radiation beam B (e.g. UV radiation or EUV radiation). A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjusting device configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The term "lens", where the context allows, may refer to any one or combination of various types of optical components, including refractive, reflective, magnetic, electromagnetic and electrostatic optical components.

The term "layer" used herein, as known to the person skilled in the art, may describe layers having one or more boundary surfaces with other layers and/or with other media like vacuum (in use). However, it should be understood that "layer" may also mean part of a structure. The term "layer" may also indicate a number of layers. These layers may be next to each, other or on top of each other, etc. They may also include one material or a combination of materials. It should also be noted that the term "layers" used herein may describe continuous or discontinuous layers. In the present invention, the term "material" used herein may also be interpreted as a combination of materials. The term "deposition" herein refers to material that is chemically or physically attached to a surface (e.g. the surface of an optical element), as known to the person skilled in the art. Such deposition may be a layer, but it may also include a multi-layer structure. The deposition may include a cap layer but it may also include undesired deposits like sputtered elemental particles from a source. The deposition may also include redeposition products or evaporation products that have deposited. The deposition may also include a cap layer as protection layer including such sputtered particles, e.g. after use of an apparatus with a source that sputters particles, or including a deposition from material including one of more elements selected from the group of B, C, Si, Ge and Sn. The term "element" in the phrase "wherein the deposition includes one or more elements selected from the group of B, C, Si, Ge and Sn and combinations thereof", or "wherein the cap layer includes one or more elements selected from the group of B, C, Si, and Ge and combinations thereof", herein refers to a deposition or cap layer including one or more of these elements, or including particles including one or more of such elements, or including compounds (like Si oxides, Si carbides, Si nitrides, etc.) including one or more of these elements, or including alloys including one or more of these elements, or combinations thereof (like e.g. deposition including Sn, O, C and H), as will be clear to the person skilled in the art. The phrase "deposition including one or more elements selected from the group of B, C, Si and Ge and combinations thereof", may in a specific embodiment refer to mono- or multi-layers including atomic B, C, Si or Ge, or combinations thereof. Elemental layers or nitride layers, etc., may include oxygen impurities, as known to the person skilled in the art.

The term "halogen containing gas" or "hydrogen containing gas" refers to gasses or gas mixtures including at least a halogen gas or hydrogen gas, respectively. The term "halogen" in the term "halogen containing gas" refers to at least one or more selected of F, Cl, Br and I, either as an atom (radical) or as compound, for example $F_2$, $Cl_2$, $Br_2$, $I_2$, HF, HCl, HBr, HI, interhalogen compounds, for example $ClF_3$, or other compounds including one or more selected of F, Cl, Br and I which can be brought into the gas phase at a temperature between about 50-500° and which may a) either react or reduce compounds (deposition) including one or more of B, C, Si, Ge and Sn, respectively, to elemental B, C, Si, Ge and Sn, respectively, or b) react with compounds including one or more of B, C, Si, Ge and Sn, respectively, under the formation of volatile products, or c) react with compounds including one or more of B, C, Si, Ge and Sn, respectively, under the formation of products that may form volatile upon reaction with a halogen or a hydrogen, or d) react with elemental B, C, Si, Ge and Sn, respectively, to form volatile products, or e) provide halogen radicals when brought into contact with, for example, a hot wire or a plasma (such that these radicals can react with deposition). $F_2$, $Cl_2$, $Br_2$, $I_2$ may be used, in particular $I_2$. Such gasses may further include additional components like buffer gasses, such as Ar, etc. The term "halogenide" refers to, for example, binary and higher compounds of a halogen like I, Br, Cl, etc. with, for example, C, Si or Ge, for example $CCl_4$, $SiCl_4$, etc.

The terms "radiation" and "beam" used herein encompass all types of electromagnetic radiation, including ultraviolet (UV) radiation (e.g. having a wavelength λ of 365, 248, 193, 157 or 126 nm) and extreme ultra-violet (EUV or soft X-ray) radiation (e.g. having a wavelength in the range of 5-20 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100-200 nm. DUV is Deep UV, and is usually used in lithography for the wavelengths produced by excimer lasers like 126 nm-248 nm. The person skilled in the art understands that radiation having a wavelength in the range of, for example, 5-20 nm relates to radiation with a certain wavelength band, of which at least part is in the range of 5-20 nm.

Figure 2:
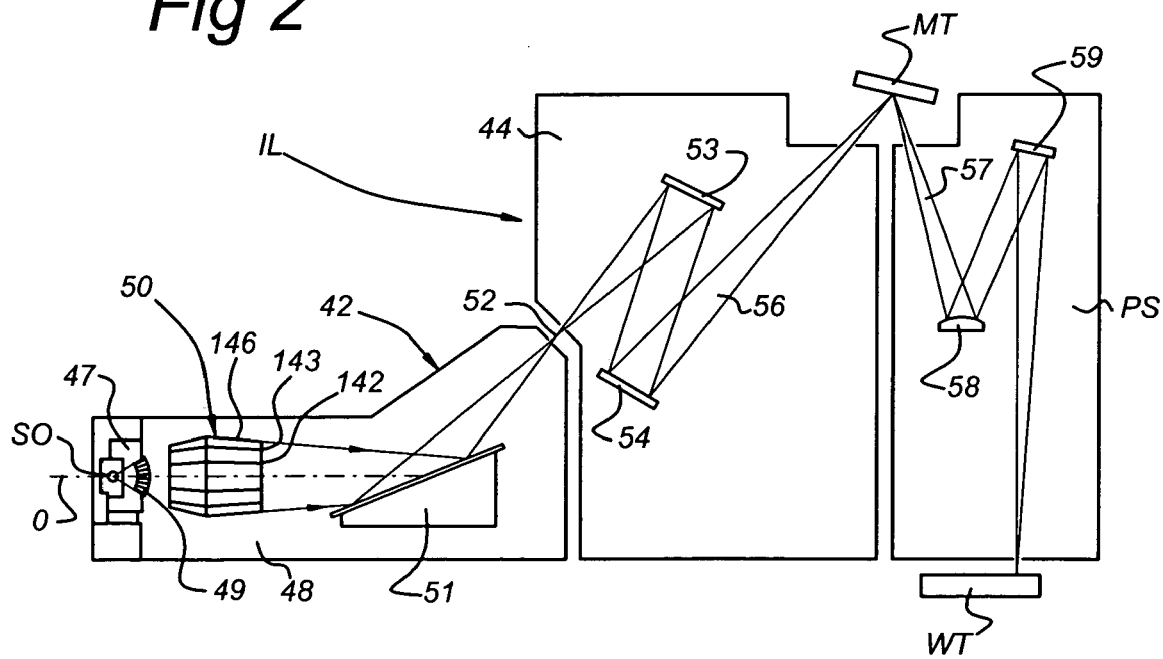
FIG. 2 schematically depicts a side view of an EUV illumination system and projection optics of a lithographic projection apparatus according to FIG. 1.

FIG. 2 shows the projection apparatus 1 in more detail, including a radiation system 42, an illumination optics unit 44, and the projection system PS. The radiation system 42 includes the radiation source SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contamination trap 49 (which is positioned in or behind an opening in source chamber 47). The gas barrier 49 includes a channel structure, for example, as described in detail in U.S. Pat. Nos. 6,359,969, 6,576,912 and 6,614,505 and WO 2004/104707, which are incorporated herein by reference.

The collector chamber 48 includes a radiation collector 50 which may be formed by a grazing incidence collector. Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto a reticle or mask positioned on reticle or mask table MT. A patterned beam 57 is formed which is imaged in projection system PS via reflective elements 58, 59 onto wafer stage or substrate table WT. More elements than shown may generally be present in illumination optics unit 44 and projection system PS. Grating spectral filter 51 may optionally be present, depending upon the type of lithographic apparatus. Further, there may be more mirrors present than those shown in the figures, for example there may be 1-4 more reflective elements present than 58, 59.

Radiation collectors 50 are known from the prior art. One example of a radiation collector that may be used in the present invention is described in U.S. Patent Application Publication 2004/0094724 A1, for example in FIGS. 3 and 4, which is incorporated herein by reference.

The lithographic apparatus as shown in FIGS. 1 and 2 may be a lithographic apparatus for an EUV lithographic apparatus, for example including an illumination system configured to condition a radiation beam; a support configured to support a patterning device, the patterning device being configured to impart the radiation beam with a pattern in its cross-section to form a patterned radiation beam; a substrate table configured to hold a substrate; a projection system configured to project the patterned radiation beam onto a target portion of the substrate; a source of radiation; and a radiation collector.

All optical elements shown in FIG. 2 (and optical elements not shown in the schematic drawing of this embodiment) are vulnerable to deposition of, for example, Sn. This is the case for the radiation collector 50 and, if present, the grating spectral filter 51. Hence, the method of the present invention may be applied to those optical elements, but also to normal incidence reflectors 53, 54 and reflective elements 58, 59 or other optical elements, for example additional mirrors, gratings, etc.

Figure 3:
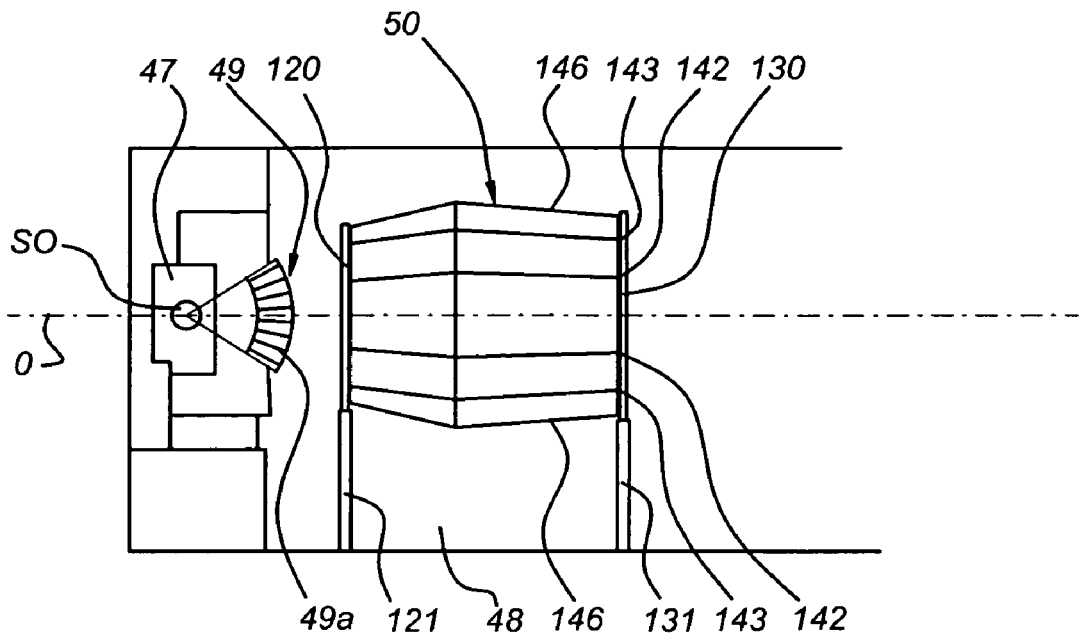
FIG. 3 schematically depicts shutters enclosing the radiation collector according to an embodiment of the present invention.
Figure 4:
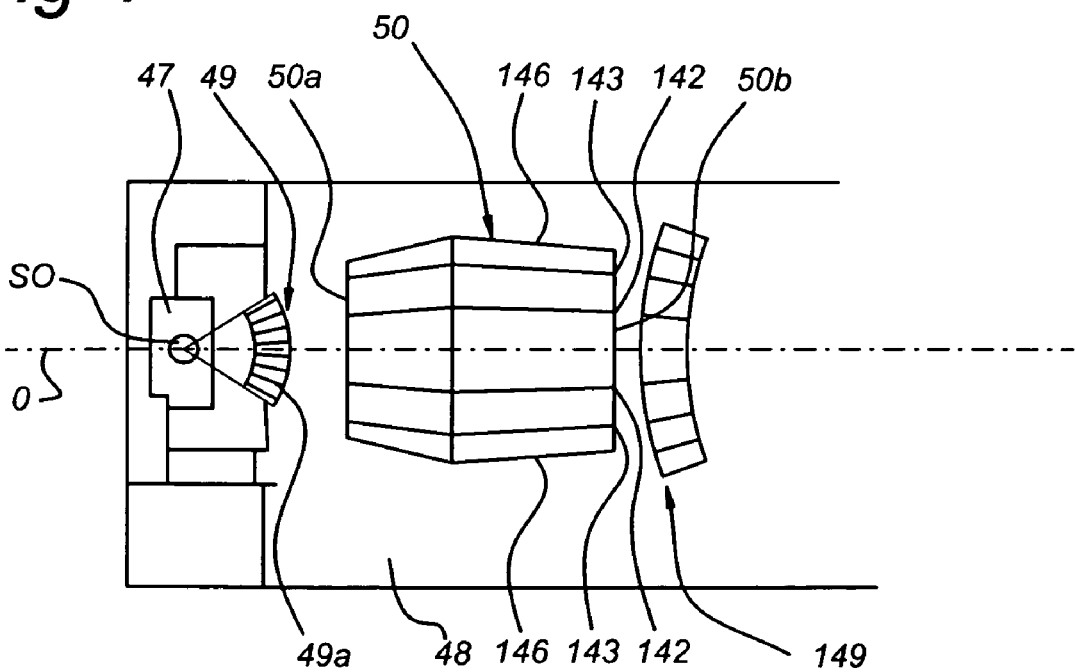
FIG. 4 schematically depicts lamellar contaminant barriers enclosing the radiation collector according to an embodiment of the present invention.

As can be seen in FIG. 3 of U.S. Patent Application Publication 2004/0094724 A1, the grazing incidence collector 10 of this figure includes a number of nested reflector elements. A grazing incidence collector of this type is, for example, also shown in U.S. Patent Application Publication 2003/0095623 A1, which is incorporated by reference. As indicated in FIGS. 2-4 of the present invention, a collector 50 is aligned along an optical axis 0. The collector 50 may include reflectors 142, 143, 146. In FIGS. 2-4, the inner reflector is indicated by reference number 142, the outer reflector is indicated by reference number 146. The radiation collector 50 encloses a certain volume, i.e. the volume within the outer reflector(s) 146. Usually, this volume within outer reflector(s) 146 is circumferentially closed, although small openings may be present. In between the reflectors 142 and 146 other reflectors 143 may be located. All the reflectors 142, 143 and 146 include surfaces of which at least part includes a reflective layer or a number of reflective layers as described in, for example, U.S. Patent Application Publication 2004/0094724

A1. On the surface of these reflective layers, there may in addition be a cap layer for protection or as optical filter provided on at least part of the surface of the reflective layers.

The radiation collector 50 is usually placed in the vicinity of the source SO or an image of the source SO, and the reflector assembly may include at least an inner reflector 142 and an outer reflector 146 extending in the direction of an optical axis 0 on which the source SO or an image of the source SO is located, the inner reflector 142 being closer to the optical axis than the outer reflector 146, the reflectors each having an inner reflective surface. Each reflector may include at least two adjacent reflecting surfaces (see also FIGS. 5 and 6), the reflecting surfaces further from the source SO being placed at smaller angles to the optical axis than the reflecting surface that is closer to the source SO. In this way, a grazing incidence collector 50 is constructed for generating a beam of (E)UV radiation propagating along the optical axis. Preferably, at least two reflectors are placed substantially coaxially and extend substantially rotationally symmetric around the optical axis. A grazing incidence collector of this Wolter-type is described, for example in U.S. Patent Application Publications 2003/0095623 A1 and 2004/0094724 A1.

On one or more of the outer 146 and inner 142/143 reflector (s) deposition may be found. As described in U.S. patent application Ser. No. 10/956,344, which is incorporated herein by reference, the deposition may include one or more elements selected from the group of B, C, Si, Ge and Sn. C (carbon) may be a deposition on the radiation collector 50 due to the undesired presence of hydrocarbons in the lithographic apparatus, but may also be deliberately present as protective cap layer. Si (silicon) may also be deliberately present as protective cap layer, whereas Sn (tin) may be present due to a source SO that produces Sn, but may be deliberately present as protective cap layer.

Deposition of Sn, for example due to a Sn source, may, after a few mono-layers, be detrimental to reflection of the radiation collector 50 or other optical elements, which may necessitate the cleaning of such optical elements. Further, Si may be present as deposition due to outgassing of the resist. The deposition may also include, for example, Mo, W, Fe, Al, Ni, etc. materials that are used in, for example, the walls of the apparatus, the electrodes, gas barriers, etc.

During use of the lithographic apparatus, the radiation collector 50 gets contaminated and/or a protective layer on the radiation collector 50 is deteriorated by such deposition. Deposition, especially deposition including one or more elements selected from the group of B, C, Si, Ge and Sn, may be removed by halogens, for example, $F_2$, $Cl_2$, $Br_2$ and $I_2$ and, for example, by hydrogen radicals, by combinations of hydrogen radicals and one or more halogens, either applying simultaneously or subsequently.

In a first embodiment, the following processes are performed: cleaning with atomic hydrogen to reduce $Sn_x$ (and/or other oxide deposition, for example silicon oxides, on radiation collector 50) to Sn (and/or other elemental or metallic compounds, respectively, for example Si); cleaning with a halogen, for example $I_2$, to remove Sn (and/or other elemental compounds, for example. Si) in the form of halogenides, for example iodides (and/or other halogenides, for example $SiI_4$).

This may be performed by a method including, during or after use of the apparatus, removing at least part of the deposition from the radiation collector in a removal process including providing a $H_2$ containing gas in at least part of the apparatus; producing hydrogen radicals from $H_2$ from the $H_2$ containing gas; bringing the radiation collector with the deposition into contact with at least part of the hydrogen radicals and reducing at least part of the deposition; providing a halogen containing gas in at least part of the apparatus; and bringing the radiation collector with the deposition into contact with at least part of the halogen containing gas and removing at least part of the deposition.

In a second embodiment, the hydrogen containing gas also includes halogen gas, such that these two processes as described above are performed substantially simultaneously.

This may be performed by a method including, during or after use of the apparatus, removing at least part of the deposition from the radiation collector in a removal process including providing a $H_2$ and a halogen containing gas in at least part of the apparatus; producing hydrogen radicals from $H_2$ from the $H_2$ containing gas; and bringing the radiation collector with the deposition into contact with at least part of the hydrogen radicals and the halogens in the gas and removing at least part of the deposition.

In a third embodiment, cleaning is only performed with atomic hydrogen to reduce and volatilize tin oxides (and/or other oxide deposition, for example silicon oxides, on radiation collector 50) to volatile tin hydrides (and/o other hydrides, for example silicon hydride, germanium hydride, etc.).

This may be performed by a method as described in U.S. patent application Ser. No. 10/956,344, including, during or after use of the apparatus, removing at least part of the deposition from the radiation collector in a removal process including providing a $H_2$ containing gas in at least part of the apparatus; producing hydrogen radicals from $H_2$ from the $H_2$ containing gas; and bringing the radiation collector with the deposition into contact with at least part of the hydrogen radicals and removing at least part of the deposition.

In a fourth embodiment, cleaning is only performed with a halogen containing gas to volatilize tin (and/or other deposition, for example silicon on radiation collector 50) and thereby remove deposition on the radiation collector 50.

This may be performed by a method as described in U.S. patent application Ser. No. 10/956,344, including, during or after use of the apparatus, removing at least part of the deposition from the radiation collector in a removal process including providing a halogen containing gas in at least part of the apparatus; bringing the radiation collector with the deposition into contact with at least part of the halogen containing gas and removing at least part of the deposition.

During these reactions, $H_2O$ may be formed as well as hydrides and/or halogenides. Reactions of Sn or Sn oxide are described in, for example, the Gmelin-Handbook of Inorganic and Organometallic Chemistry. In case there is a deposition with Sn, or a cap layer with Si or Ge, due to the presence of small amounts of oxygen, there will usually also be to some extent Sn oxide and Si or Ge oxide, respectively. To remove these oxides, a reduction step may be necessary before elemental Sn, Si, Ge can be removed by the formation of halogenides and/or hydrides.

To this end, a gas selected from the group of a halogen containing gas and/or a hydrogen containing gas may be provided to the radiation collector 50, especially to the inner volume of the radiation collector 50, where the reflective layers are found and which may have been deteriorated by deposition, for example deposition of Sn from the source SO, or where, for example, protective layers on the reflective layer(s) of the radiation collector 50 have been deteriorated by debris (e.g. ions, electrons, clusters, droplets, electrode corrosion) from the source SO.

The gasses may be substantially provided to this volume enclosed by the outer reflector 146, since otherwise the gasses may attack other parts of the lithographic apparatus. For example, some of the halogens may be corrosive for some of the optical and/or construction materials. Hence, for the purpose of removing the deposition, there are provided gas barriers to one or both ends of the radiation collector 50, i.e. close to the end directed to the source SO and close to the end directed to illumination unit. In an embodiment, the present invention is directed to a method and lithographic apparatus wherein the gas barrier is selected from the group of a lamellar contaminant barrier, for example 49 and 149, respectively, and a shutter, for example 120 and 130, respectively. Such lamellar contaminant barriers 49 and 149 include a channel structure, for example as described in U.S. Pat. Nos. 6,614,505 and 6,359,969. Further, in an embodiment, the lamellar contaminant barrier 49 or 149 or both may rotate around an axis.

Shutters may be any sliding, rotating or movable elements or devices, for example valves, doors, diaphragms, etc, that can be provided at one or both ends of the radiation collector 50. Combinations of gas barriers may also be used, for example a stack, arranged in the order of source to wafer, of a first lamellar contaminant barrier, a first shutter, a radiation collector, and optionally one or more selected from a second shutter and a second lamellar contaminant barrier. Herein, the term "shutter" refers to doors, valves, diaphragm shutter, or other element or device to close a room, space, tube, etc., and in the context of the present invention also one side of the radiation collector 50. Herein, internal volume is the volume enclosed by the outer reflectors 146 and both sides 50a and 50b of radiation collector 50. Further, "enclosure volume" refers to this internal volume, or to the volume provided by the outer reflectors 146 and both doors 120 and 130 (see for example FIG. 3), or to the volume provided by the outer reflectors 146 and lamellar contaminant barriers 49 and 149 (see for example FIG. 4), i.e. the volume provided by the outer reflector 146 and the gas barriers. The term "radiation collector enclosure" refers to the elements providing the radiation collector volume, i.e. outer reflectors 146 and both doors 120 and 130 (see for example FIG. 3), or to the volume provided by the outer reflectors 146 and lamellar contaminant barriers 49 and 149 (see for example FIG. 4), i.e. outer reflector 146 and the gas barriers. It should be appreciated that radiation collector 50 may have further features on the external surface of outer reflector 146 or further features around outer reflector 146, for example a protective holder, a heater, etc. Herein, the phrase "one or more gas barriers at one or both ends of the radiation collector" refers to a radiation collector having at one end at least one gas barrier or at each ends a gas barrier, or at one end or at each end more than one gas barrier, for example the stack described above. Hence, the term "lamellar contaminant barrier" may also refer to a number of lamellar contaminant barrier, with optionally one or more of these lamellar contaminant barriers being rotational.

The gas barriers provide a flow resistance from gasses from the volume of the radiation collector 50 to the rest of the apparatus. For, example, assuming a pressure of between 0.1-2000 mbar in the internal volume of the radiation collector 50, for example about 2-10 mbar, a pressure difference of between about 0.1-2000 mbar, desirably an over pressure, for example about 5-10 mbar (i.e. 5-10 mbar larger than the pressure in the volume of radiation collector 50), may be maintained between this internal volume and the part of the lithographic apparatus including the radiation collector 50 (i.e. the pressure of chamber 48 in, for example, FIGS. 2, 8 and 9). A pressure of about between 0.1-2000 mbar, for example 1-2000 mbar, may be maintained in the internal volume of the radiation collector 50. The gas barriers are designed such that the diffusion of halogens and/or the metal-halogen reaction products through the barrier are suppressed such that the partial pressure of these compounds in the part of the lithographic apparatus including the radiation collector 50 is below about $10^{-6}$ mbar, for example below about $10^{-7}$ mbar, for example below about $10^{-8}$ mbar, for example below about $10^{-9}$ mbar.

The lithographic apparatus further includes elements or devices configured to maintain a pressure outside the radiation collector enclosure volume of 0.1-2000 mbar larger than within the radiation collector enclosure volume. Such elements or devices may include a number of gas pumps 6, a number of exhausts/inlets 2 (see below), that are connected to or in gas contact with the radiation collector enclosure volume and the volume outside this radiation collector enclosure volume, respectively (i.e. chamber 48). In this way, a pressure outside the radiation collector enclosure volume of 0.1-2000 mbar, for example about 1-2000 mbar, larger than within the radiation collector enclosure volume can be maintained. The elements or devices to maintain a pressure difference may further include valves, pressure detectors (within and/or outside the enclosure), etc, which may be connected to a computer that may be provided with a program to control the pressure(s), etc.

Referring to FIG. 3, two shutters (or valves, doors, etc.) 120 and 130, respectively, are provided, at both ends (see also FIGS. 4 and 7: reference numbers 50a and 50b, respectively) of radiation collector 50, thereby providing an enclosure volume enclosing an internal volume of radiation collector 50. The internal volume of radiation collector 50 is the volume enclosed by outer reflectors 146, the end 50a directed to source SO (i.e. the end in this figure closed by shutter 120 in FIG. 3) and the end 50b directed to the illumination optics IL (i.e. the end in this figure closed by shutter 130 in FIG. 3). Shutters 120 and 130 are removed or opened, when the lithographic apparatus is in use, and are closed when the radiation collector 50 is treated with the gasses in order to remove deposition on the internal surface of radiation collector 50. Note that in FIG. 3 a lamellar contaminant barrier 49 is also shown, which may optionally be present. Shutters 120 and 130, respectively, may be slide shutters with a holder 121 and 131, respectively, but they may also be present on a wheel or any device. This embodiment may be directed to removal of deposition after some time of use of the lithographic apparatus.

Referring to FIG. 4, two lamellar contaminant barriers 49 and 149, respectively, are provided, at both ends of radiation collector 50, thereby providing an enclosure volume enclosing the internal volume of radiation collector 50. Both lamellar contaminant barriers 49, 149 provide a gas barrier. In order to have the lamellar contaminant barriers 49 and 149, respectively, keep the corrosive gasses trapped within the enclosure of radiation collector 50, the opening between lamellar contaminant barrier 49 and radiation collector 50 and between radiation collector 50 and lamellar contaminant barrier 149, respectively, should be minimal. Small gaps are allowed (as discussed in a variant below). In FIG. 4, these gaps are relatively large (not on scale). In a variant, sheets may be installed to close off the volume.

Due to the barrier, the diffusion of, for example, iodine and other components is reduced. Due to collisions in the gas phase with the gas barrier, like lamellar contaminant barrier(s) 49 and 149, respectively, the molecules are stopped and the flow direction is reversed back to the inner collector.

The pressure within the enclosure volume should be sufficiently high that there is viscous flow. At lower pressure (molecular flow) there may be insufficient collisions in the gas phase to suppress the iodine or other molecules.

The exact pressure depends on the dimensions of the barrier sheets. Viscous flow is obtained for a Knudsen value ≦0.1 (K=mean free path/characteristic dimensions), for example ≦0.01; as an example for 10 cm long narrow parallel plates 49a, a pressure ≧0.1 mbar is needed. The length L (length of lamellar plate 49a in the direction of the radiation) vs. height h between parallel plates L/h>>1, for example for a length of 10 cm the distance between the plates should be typically smaller than 2 cm. Large lengths L and smaller heights h are preferred. However at the same time the smaller h the smaller the counter flow is with which suppression is reached, for example with a 10 cm long foil trap with foils at every 2 mm a much smaller pressure difference is needed than for a 10 cm long foil trap with foil at every 2 cm. A typical lamellar contaminant barrier dimension could be between about 100 and 200 lamellas 49a at a distance ranging from 6 mm at the collector side to 0.6 mm at the side directing intermediate focus 52 (FIG. 2). There is sufficient space for lamellar contaminant barrier 149 so this lamellar contaminant barrier may be 10 cm long, up to even 30-40 cm. The weight of the barrier gas used is also a consideration. Heavy Ar is better to suppress $I_2$ than lightweight He. Herein the barrier gas is used as gas influx through the barrier to the internal volume of the radiation collector 50.

When using a lamellar contaminant barrier, the lamellar elements 49a may be between about 5-50 cm, with a distance between the lamellar elements 49a at the source side for lamellar contaminant barrier 49 of about 0.2-1 mm and of about 2-10 mm at the collector side; and with a distance between the lamellar elements 49a at the source side for lamellar contaminant barrier 149 of about 2-20 mm at the collector side and of about 0.2-2 mm at the intermediate focus 52 side. Each lamellar contaminant barrier may include about 50-400 lamellar elements 49a, for example 75-375 lamellar elements 49a.

In an embodiment, the lamellar contaminant barrier 49 or 149, or both, stay(s) in place, also during EUV exposure. In this case the lamellar contaminant barrier should absorb a minimum amount of EUV, the amount of lamellas should be reduced. Hence, in this embodiment, advantageously the deposition can also be removed during use of the lithographic apparatus (i.e. during manufacturing devices). In another embodiment, one or both lamellar contaminant barriers 49 and/or 149, respectively, are positioned outside the EUV beam and put in place during cleaning. In this case much more foils can be used. Hence, in this embodiment, transportation means are present to arrange lamellar contaminant barrier 49 and/or 149, respectively, as gas barrier to ends 50a and/or 50b, respectively for use in cleaning, and to remove lamellar contaminant barrier 49 and/or 149 during use of the lithographic apparatus.

Instead of replacing the complete radiation collector 50, the present invention provides a method, wherein the surface of the radiation collector 50 can be at least partially repaired or cleaned by removing deposition from the surface of the radiation collector 50.

In an embodiment, there is provided a method wherein the gas includes a $H_2$ containing gas, and wherein the method further includes producing hydrogen radicals from $H_2$ from the $H_2$ containing gas. In this way, the deposition is removed in the removal process by bringing the deposition into contact with hydrogen radicals. The hydrogen radicals may be produced in different ways. In an embodiment of the method of the present invention, at least part of the hydrogen radicals are produced from $H_2$ from the $H_2$ containing gas by one or more radical formation devices selected from the group of a hot filament, a plasma, radiation, and a catalyst configured to convert $H_2$ into hydrogen radicals, which dissociate $H_2$ to H radicals or H-atoms adsorbed to the surface of the catalyst. The catalyst may include transition metal based catalysts, for example catalysts including Pd, Pt, Rh, Ir and Ru. The catalyst may also include a Ru layer, for example the surface of a grazing incidence mirror or of a multilayer of the radiation collector 50, wherein Ru is included in a top layer. The radiation for producing radicals may include radiation such as EUV radiation, DUV radiation, UV radiation, for example radiation including radiation having a wavelength selected from the group of 193 nm, 157 nm and 126 nm, and the radiation may include radiation such as electron beam or ionizing radiation, such that hydrogen radicals may be formed from hydrogen. In an embodiment, the source SO of a lithographic apparatus is used as a source SO of radiation to produce radicals. In another embodiment, an additional radiation source is present, to provide such radiation that induces formation of hydrogen radicals from hydrogen gas. In an embodiment, at least part of the hydrogen radicals may be produced as described in U.S. patent application Ser. No. 10/956,344. The hydrogen radicals react with Sn (or Sn oxides), C, Si (or Si oxides), etc., leading to volatile hydrides and/or water (e.g. when an oxide like Sn oxide is reduced) that may be removed by, for example, an exhaust. Sn and Si, that may have oxidized or which may be at least partially present as oxide as deposition or cap layer may be reduced to elemental Sn and Si, respectively, and may be removed as hydride. Deposition, for example one or more elements selected from the group of B, C, Si, Ge and Sn, may be removed by hydrogen radicals, but, for example, Sn may also be removed by providing halogens. Therefore, in yet another embodiment, the $H_2$ containing gas may further include a halogen gas. The halogens may form volatile halides, and may improve the removal of e.g. Sn and Si deposition. In an embodiment, there is provided a method wherein the gas includes a $I_2$ containing gas, since this gas shows good results by selectively removing deposition from the surface of the mirror, in particular for Sn deposition, with small or substantially no corrosion effects to other parts of the lithographic apparatus.

Figure 5:
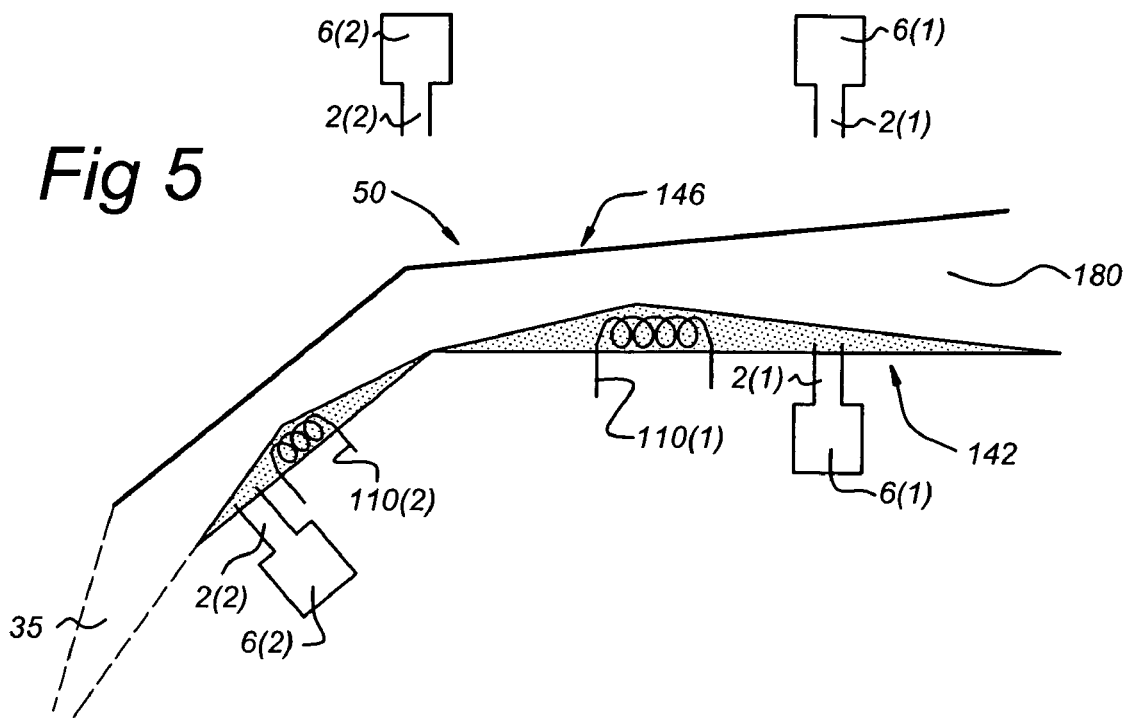
FIG. 5 schematically depicts a part of a radiation collector and filaments according to an embodiment of the present invention.
Figure 6:
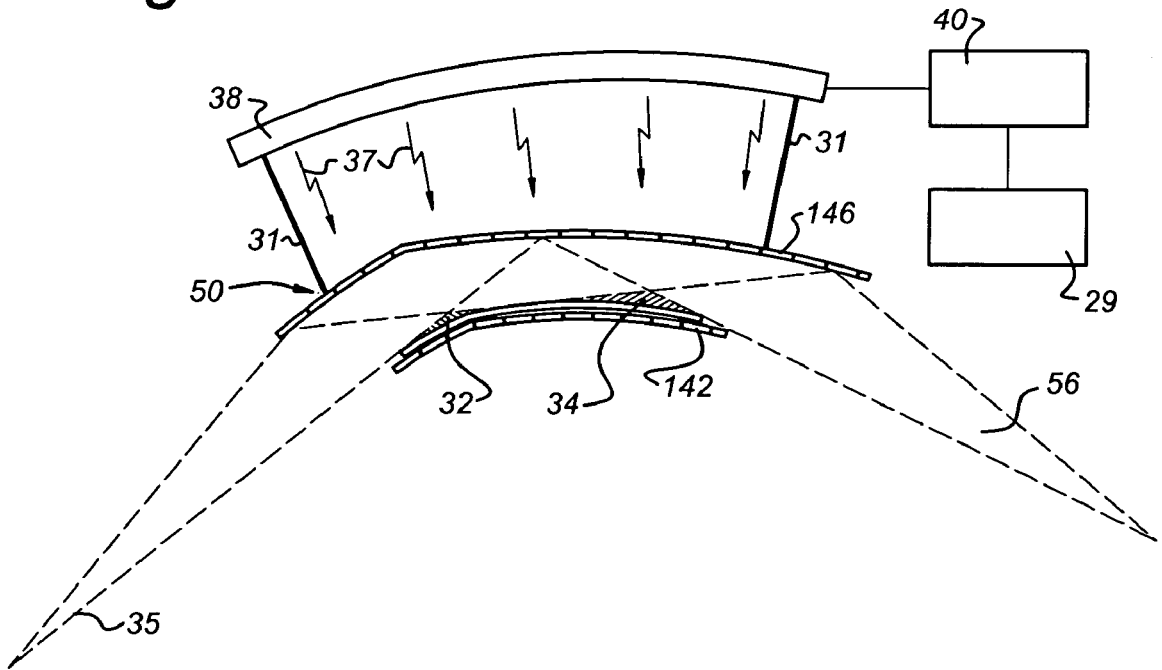
FIG. 6 schematically depicts a part of a radiation collector with temperature controller according to an embodiment of the present invention.

FIG. 5 schematically depicts a part of a radiation collector 50, including a first mirror 142 and a second mirror 146 (in FIGS. 2-4, reflectors 146 and 142, respectively). Radiation collector 50 may include more than two mirrors to collect EUV radiation 35 and to a produce beam of radiation 56 (FIG. 6). Within space 180 between mirrors 142 and 146, there are some parts of the space 180 which are arranged outside the EUV radiation 35, i.e., in the shadow of mirror 146. These parts of space are indicated by gray areas. For example, these spaces can be used to arrange a filament 110, as indicated in the figure with filaments 110(1) and 110(2).

In order to remove deposition on the reflectors/mirrors 142 and 146, gas according to the invention, for example hydrogen gas, may enter space 180 and may be at least partially converted by heated filaments 110 to hydrogen radicals which may remove a undesired deposition such as Sn from source SO (not shown in this figure) and/or reduce, for example Sn oxide to Sn, according to U.S. patent application Ser. No. 10/956,344.

In a variation on this embodiment, one or more gas supplies 6(1) and 6(2) with outlet(s) 2(1) and 2(2), may be positioned in the space where mirror 50 is positioned. I should be appreciated that the position may be chosen. In a further variation, the gas supplies may be positioned in such a way that outlets 2(1) and 2(2) are also in the parts of space 180 which are arranged outside the EUV radiation 35, i.e., in the shadow of mirror 146. FIG. 5 shows examples of positions of the gas supplies 6(1) and 6(2), respectively.

For example, after providing the gas to the internal volume of the radiation collector, shutters 120 and 130 may be closed, and filaments 110 may be heated such that hydrogen radicals are formed, in the case of a hydrogen gas. A typical temperature for filament 110 is between about 1400 and 2400° C. Typical temperature in the internal volume of the radiation collector during treatment is between room temperature (about 20° C.) and 500° C., with a desired temperature range of about 50-300° C., for example between about 100 and 200° C. Heating filament(s) 110 as well as a heating element 38 integrated in a shutter 120 or 130 (see e.g. FIG. 7*a*) as well as other heating elements can be used to provide this temperature. Typical pressures are, for example, between about $10^{-5}$ and 2000 mbar, for example between about 0.1 and 2000 mbar, whereas the pressure in element 48 of the lithographic apparatus is maintained at a higher pressure than in the internal volume of the radiation collector 50, typically between about 1-2000 mbar (higher than the pressure in the internal volume of radiation collector 50). The hydrogen partial pressure may be about $10^{-6}$-2000 mbar, for example between about $10^{-5}$ and 2000 mbar.

As described above, subsequently to the process of providing hydrogen radicals, simultaneously with the process of providing hydrogen radicals or substituting the process of providing hydrogen radicals, halogens may be provided by providing a halogen containing gas.

In the case of halogens, for example $I_2$, the temperature is between about 100 and 500° C., with a desired temperature range of 100-300° C., for example between about 130 and 200° C. Heating filament(s) 11,0 as well as a heating element 38 integrated in a door shutter or 130, as well as other heating elements can be used to provide this temperature. Typical pressures are, for example, between about 0.1-2000 mbar, preferably 1-2000 mbar, whereas the pressure in collector chamber 48 of the lithographic apparatus is maintained at a higher pressure than in the internal volume of the radiation collector, typically between about 1-2000 mbar higher. The halogen (e.g. $I_2$) partial pressure may be about $10^{-7}$-$10^{-2}$ mbar, for example about $10^{-5}$-$10^{-4}$ mbar. In an embodiment, heating filaments 110 may also be used to provide halogen radicals from halogen or halogen compounds contained in the halogen containing gas.

Hence, in yet a further embodiment, the lithographic apparatus further includes one or more heating elements for heating the enclosure volume. FIG. 6 schematically depicts a part of a radiation collector 50, including a first mirror of 142 and a second mirror 146. Within space 180 between mirrors 142 and 146, there are some parts of space 180 which are arranged outside the EUV radiation 35, i.e., in the shadow of mirror 146. These parts of space are indicated by gray areas with reference numbers 32 and 34. For example, these spaces can be used to arrange a filament 110 (as shown in FIG. 5). However, these areas can also be used to arrange heating wires or tubes for transporting hot or cold fluids in order to control the temperature (not shown). FIG. 6 schematically shows a heat source 38 controlled by a controller 40. The heat source 38 may be connected to mirror 142 by connectors 31. The connectors 31 may be heated conductively. The controller 40 may be implemented as a suitably programmed computer, or a controller with suitable analogue and/or digital circuits. The heat source 38 generates heat, indicated with arrows 37, which is directed to a first mirror of 142 of radiation collector 50. Heat source 38 may also be physically connected to mirror 142. Heat source 38 may include different heating elements and/or may be arranged such that different areas of mirror 142 can selectively be heated. In this way, layer growth and layer removal of a cap layer or deposition may better be controlled. Heat source 38 may be controlled by controller 40, which may amongst others also control a pump 29, or measuring devices such as thermocouples, gas pressure, gas flow, an analysis unit that analyses reflectivity of mirror 142 and/or mirror 146, an analysis unit that measures deposition layer thickness, etc (not shown in FIG. 6, but known to the person skilled in the art). Heaters, for example heat source 38, but also heating elements connected to radiation collector 50, may be selected from the group of heating wires (like filaments 110 in FIG. 5), tubes containing/transporting hot fluids or hot gasses, providing hot/heated gasses to the volume to be heated, heaters connected to or in thermal contact with radiation collector 50 (such as heat source 38 in FIG. 6) or heaters connected to or in thermal contact with gas barriers (such as heat source 38 in FIGS. 7*a* and 7*b*), heating lamps (like IR lamps) and an EUV source (like source SO). The latter two may e.g. be used as preheating source. An IR source may be provided, for example at end 50*b* in an embodiment wherein no shutter 130 or a partly opened shutter 130 is used.

The present invention also provides a lithographic apparatus, wherein the lithographic apparatus further includes one or more heating filaments within the enclosure volume which can be used for heating the enclosure volume and/or for providing hydrogen radicals from $H_2$ in the $H_2$ containing gas. Heating of the enclosure volume may be performed in different ways. In yet a further embodiment, there is provided a method further including heating at least part of one or more selected from the group of the radiation collector enclosure (such as doors 120, 130, lamellar contaminant barrier 49 and/or 149, etc.) and heating the gas for providing to the radiation collector enclosure volume.

Referring to FIG. 5, during at least part of the use of the lithographic apparatus Sn may deposit on the radiation collector due to emission of source SO (not shown). After use of radiation collector 50, the surface of radiation collector 50 may include undesired deposition, for example Sn or hydrocarbons from plastic tubes or rest gasses, etc. or a possible cap layer may be deteriorated and needs to be removed (and replaced). This can be done according to the method described in U.S. patent application Ser. No. 10/956,344.

A gas including $H_2$ or a halogen, a combination of $H_2$ and a halogen, etc. may be provided by a gas supply 6(1) through inlet 2(1) in the space where mirrors 142 and 146 of radiation collector 50 are present. Due to the presence of hot filament 110, hydrogen gas dissociates in hydrogen radicals. Part of the hydrogen radicals will come into contact with the deposition or cap layer on the surface of radiation collector 50, where the hydrogen radicals may react with one or more of Si (including Si oxides), Sn (including tin oxides) and C, etc. In this way, radiation collector 50 with deposition is brought into contact with at least part of the hydrogen radicals and at least part of the deposition is removed. Volatile hydrides are formed, for example $SiH_4$, but which can also include tin hydrides and/or hydrocarbons like $CH_4$, etc. Also water may be formed. Volatile compounds may be at least partially removed by an exhaust or pump (gas supply 6 and inlet 2 may alternatively also be used as pump and exhaust, respectively; or a number of gas supplies 6 and inlets 2 are provided, whereby some of them provide the function of providing gas, and some of them provide the function of removing gas), for example as indicated with reference number 6(2) and 2(2), respectively. Removal rates of, for example, 100-150 nm/hour can be obtained. Growth and removal rates may be derived from ex situ X-ray fluorescence spectroscopy.

Similarly, halogen containing gas may be provided to the internal volume of the radiation collector 50. By providing a temperature between about 100° C. and 500° C., for example between about 100° C. and 300° C., for example between about 130-200° C., the halogens form, for example, tin halogenides, thereby removing at least part of the tin from the surface of radiation collector 50, in the case of deposition including Sn.

In an embodiment one or more getter plates, getter masses or getter coatings may be provided, on which one or more gasses selected from halogen gas, halogenides and hydrides may form deposits or with which they may react, which are then not detrimental to the other optical elements of the lithographic apparatus anymore. For example, a Ni coating may be used to bind $I_2$. Such getter material may be used as separate or as additional barrier, for example arranged on at least part of the surface of the shutters 120 and/or 130 directed to the internal volume of radiation collector 50, on at least part of a hull 200 (see e.g. FIG. 10).

In a further embodiment, the method further includes providing a getter material to the radiation collector enclosure volume, for example to the gas barrier (a lamellar contaminant barrier a shutter or both). Getter materials may be selected from one or more metals selected from the group of Sn, Sb, Al, Zr, Cd, Fe, Pb, Cu, Ag and Ni, which metals may react, for example, with 12. For example, Sn, Sb, Al, Zr, Cd and Fe react at about 150° C. with $I_2$ to form volatile products at these temperatures or higher, and Pb, Cu, Ag, Ni react at 300-500° C. with $I_2$ to form volatile products at these temperatures or higher. Getter material is provided and a cooling device, a heating device or both heating and cooling devices are provided. In this way, the getter material can be maintained at the desired temperature, i.e. below the temperature that volatile halogenides etc. are formed ("gettering"), but the getter material may also be heated such that the getter can be regenerated by removal of, for example, the top layer by formation of volatile halogenides, thereby also forming a fresh metal layer, that may subsequently be used as getter material. The regeneration process may also be employed offline.

In yet another embodiment, gettering is performed by providing and using the lamellar contaminant barrier or the shutters 120 and/or 130 as a cold trap, to reduce the partial pressure of halogenides. For example, most metal iodides have a low vapor pressure at room temperature and will be trapped. Hence, in an embodiment there is provided a method further including cooling at least part of one or more selected from the group of an exhaust gas from the radiation collector enclosure volume and the radiation collector enclosure, i.e. at least one selected of at least part of a shutter 120, at least part of a shutter 130, at least part of a lamellar contaminant barrier on one or both sides of the radiation collector (i.e. lamellar contaminant barrier 49 and/or 149) and at least part of a enclosing hull 200 (see below), etc., are provided with a cooling device(s), suitable for cooling that part to a temperature below room temperature, for example suitable for cooling below 0° C., for example suitable for cooling in a range of −196° C. (liq. $N_2$ temperature) and 0° C., for example about −100° C. In yet a further embodiment, such a cooling device such as a cold trap is provided to an exhaust 2(2), as schematically depicted in FIGS. 7a and 7b with cooling device 202. Hence, the radiation collector enclosure of the lithographic apparatus of the present invention may further include a cooling device for at least part of the radiation collector enclosure. Further, the lithographic apparatus of the present invention may further include a cooling device for an exhaust for exhaust gas from the radiation collector enclosure volume.

In a variation, gasses including one or more selected from the group of a halogen containing gas and a hydrogen containing gas are provided via openings or gas valves within shutters 120 and/or 130, respectively, by gas supply 6 and inlets or tubes 2, as shown in FIG. 7a. In FIG. 7a, an embodiment is shown wherein gas supply 6(1) can be used to provide gasses to the internal volume of radiation collector 50 enclosed by shutter 120 at end 50a and shutter 130 at end 50b, and wherein gas supply 6(2) may be used as a pump to remove gasses from the internal volume. Alternatively, both supplies 6(1) and 6(2) or one of them may provide a gas and after the chemistry of removing the deposition, both or one of them may serve as exhaust of halogenides or hydrogenides. Further, one or both shutters 120 and 130 may be heated with heating element 38, which may include integrated, in the shutter 120 and/or 130, coils, or any other heaters suitable for heating shutter 120 and/or 130, and/or at least part of radiation collector 50. For example, heaters 38 may be connected to a hot filament 110 at the inside of shutter 120 and/or 130. In this way, heater 38 is used to heat the radiation collector 50 and hot filaments 110 may be used to provide atomic hydrogen and/or to heat the enclosure volume. Heating element 38 may also connected to the exterior of radiation collector 50, as shown in FIG. 6. During use of the apparatus, shutters or doors 120 and 130, respectively are opened or removed. After use, they are closed and deposition may be at least partially removed from the surface of radiation collector 50, for example before the system is ready for the exposure mode again.

Figure 8:
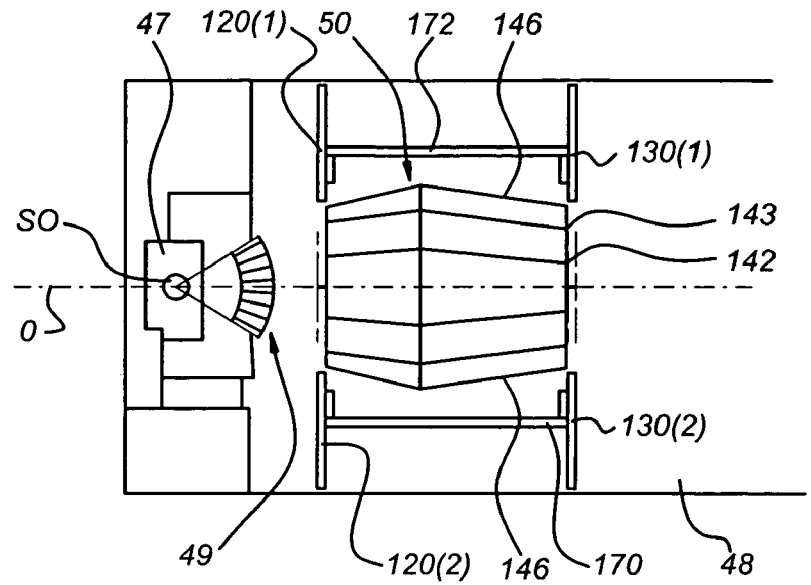
FIG. 8 schematically depicts shutters enclosing the radiation collector according to an embodiment of the present invention.
Figure 10:
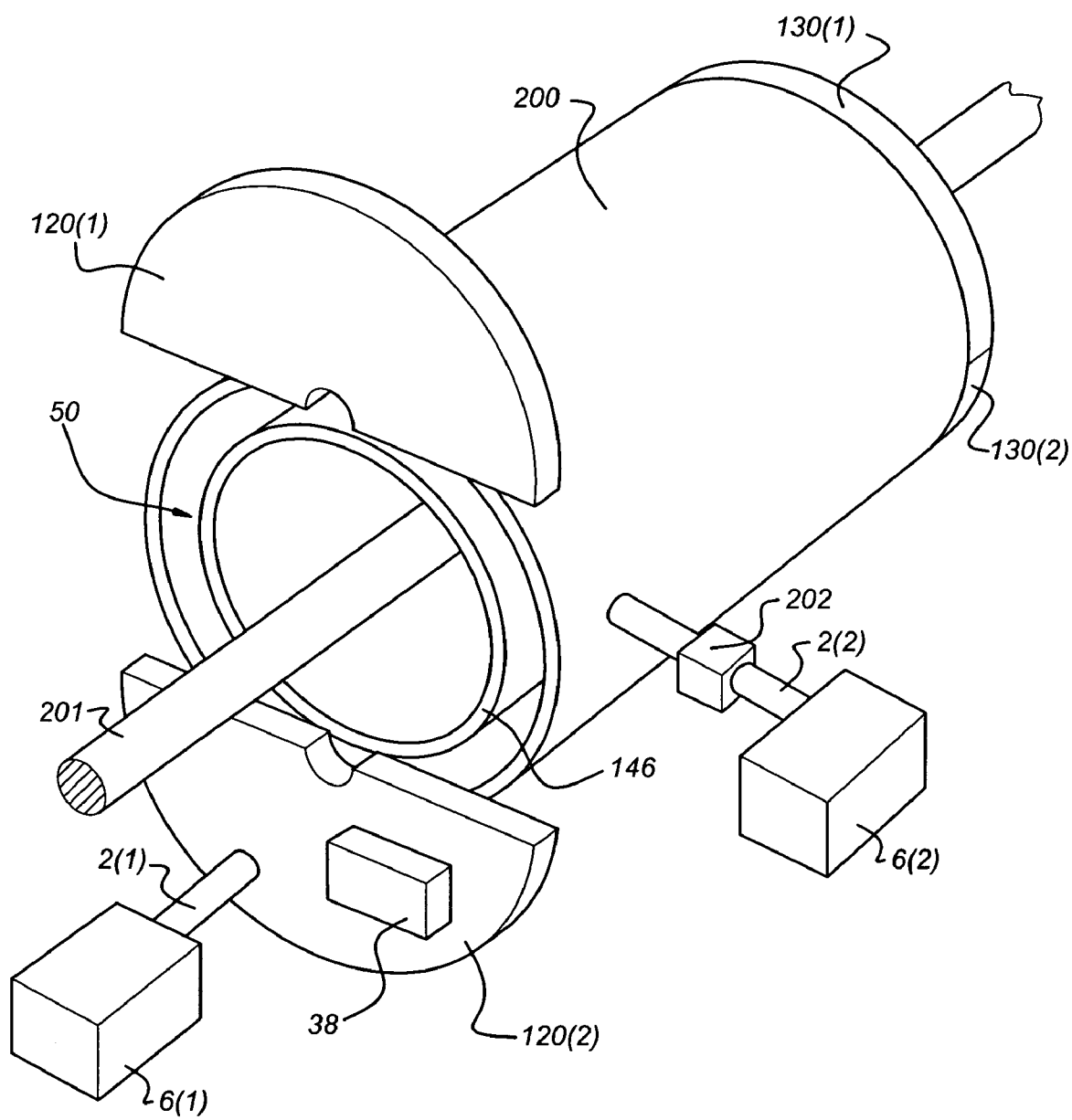
FIG. 10 schematically depicts a hull enclosing the radiation collector.

In this embodiment, there is provided an enclosure volume for radiation collector 50 that can be opened and closed. Referring to FIG. 8, this enclosure volume includes at end 50a doors 120(1) and 120(2) (forming one door, valve or shutter 120) and at end 50b doors 130(1) and 130(2) (forming one door, valve or shutter 130), which may consist of any type of doors like those schematically shown in FIG. 7a, two halves as schematically shown in FIG. 10, or e.g. diaphragm type of doors. The enclosure volume resides inside collector chamber 48 (see also FIGS. 2-4). The enclosure volume can be opened in order to allow light to pass through the optical element. The enclosure volume can be closed (indicated by the dotted lines) in order to make a controllable process-environment around the optical element. Inside the closed enclosure volume, chemically or physically aggressive media can be applied to the optical element in order to clean the optical element. The enclosure volume may be heated or cooled or both in order to assist the process inside the enclosure volume. Doors 120 and 130 may be included in a frame including support elements 170 and 172. Support elements 170 and 172 may be included in one circumferential frame configured to support radiation collector 50. More support elements may be present than depicted.

In a variant, the enclosure volume may not be sealed hermetically (not a full vacuum seal) from the collector chamber 48. Instead, defined gaps between the enclosure volume and the vacuum-chamber are permitted. These gaps allow for a defined flow of an inert or reactive gas through these gaps. This constant flow prevents escape of the aggressive media, within the enclosure volume, into collector chamber 48. The enclosure volume can be closed using doors or valves. These doors 120 and 130, respectively, shut the openings 50a and 50b, respectively. These doors can also be heated or cooled or both in order to assist the process. These doors 120 and 130, respectively, are also the location to administer and extract media into or out of the process inside the enclosure volume.

In this way, a containment of a chemically or physically aggressive process inside a collector chamber 48 is provided, the sealing of this process via leaky gaps may be simplified, the process-volume inside a collector chamber 48 is reduced, the aggressive process is substantially specified to the internal volume of the radiation collector 50 inside a large collector chamber 48 and the functions of administering and/or extracting media and closing of the enclosure volume in the doors may be combined.

FIGS. 7a and 8 (and also FIG. 3) show embodiments wherein at both ends 50a and 50b of radiation collector 50 gas barriers 120 and 130, respectively are found. These gas barriers 120 and 130 respectively, are in these embodiments doors 120 and 130, respectively. For example, door, shutter or valve 120 may include an inlet 2(1) to provide a gas (halogen, hydrogen or a combination thereof, either simultaneously or subsequently) by a gas supply 6(1) and door, shutter or valve 130 may include an outlet 2(2) as exhaust to remove gasses from the enclosure volume formed by doors 120, 130 and radiation collector 50 by a pump 6(2). In an alternative embodiment, as schematically depicted in FIG. 7b, only one door is provided, for example door 120, with in a variation an inlet 2(1) for gas (see above), but without a second door. The opening at end 50b of radiation collector 50 can be used as exhaust due to a reduced pressure of the chamber including radiation collector 50. In this way, a large exit for pumping is provided. Further, there may be a pump present, either in this chamber or outside this chamber, connected to an inlet 2(2) which has its opening in the chamber including the radiation collector 50, such that this pump can remove gasses like halogenides, hydrides, water, etc. Pump 6(2), inlet 2(2) and gas supply 6(1) may include a number of pumps, inlets and gas supplies, respectively. In this embodiment, the enclosure volume is included by the volume enclosed by radiation collector 50 and door 120 and end 50b of radiation collector 50.

Another variant is wherein a second door is provided, which does not completely close one side of the radiation collector 50. In this way, one may adjust the desired pressure differences between the enclosure volume and the surrounding atmosphere. In this embodiment, the pressure with the enclosure volume may be selected between about 0.2 and 50 mbar, for example between about 1 and 20 mbar, and the pressure outside this enclosure volume (i.e. in chamber 48) of radiation collector 50 is desirably maintained at about $10^{-6}$-1500 mbar higher, for example between about $10^{-5}$ and 1000 mbar higher than within the enclosure volume.

It should be appreciated that, in a variant, instead of door 120, door 130 may be provided; heater 38 and gas supply 6(1) and outlet 2(1) may then be provided to door 130. In both variants, gas supply 6(1) may via outlet 2(1) also provide the gas via an opening between door 120 (or 130) and radiation collector 50 or via other openings. Further, instead of one or two doors 120 and 130, respectively, lamellar contaminant barrier 49 and lamellar contaminant barrier 149, respectively, may be provided. The gas may be provided to the enclosure volume through multiple injection points, for example the gas may be provided through a lamellar contaminant barrier 49 or 149, respectively, or the gas may be provided through a plurality of openings on the enclosure side of door 120 and/or door 130. To this end, a number of gas outlets 2(1) to door 120 and/or door 130 may be provided, but one or both doors may also have a structure that distributes the gas from gas supply 6(1) via outlet 2(1) (i.e. inlet to the door) within the door to a plurality of openings at the enclosure side (like a shower head). Hence, in an embodiment, the gas is provided through one or more selected from the group of one or more lamellar contaminant barriers (49 and/or 149) and one or two doors including multiple injection points for the gas to the enclosure volume. For example, when using a shutter, the shutter may provide at least about one opening, for example at least about one opening per 100 $cm^2$, each opening having a opening area in the range of about 0.1-50 $mm^2$. The shutter may also provide a grit structure or porous plate, through which the gas is provided. In case of using a lamellar contaminant barrier, the dimensions as describe above may be used.

The open space between the collector 50 and the lamellar contaminant barrier 49 (which is in between the EUV source and the collector 50) may be very small, for example about 3-10 mm. Hence, in one embodiment there is provided a door, shutter or valve 120 with a hollow/round shape, wherein the hollow side is directed to lamellar contaminant barrier 49 and the round side is directed to the radiation collector 50 (the enclosure volume).

Figure 9A:
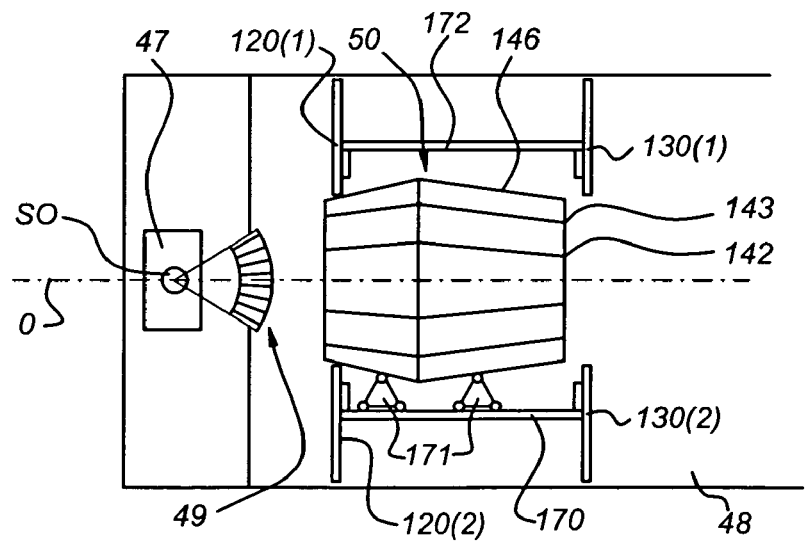
FIGS. 9a, 9b schematically depict shutters enclosing the radiation collector, wherein the radiation collector is movable, according to an embodiment of the present invention.
Figure 9B:
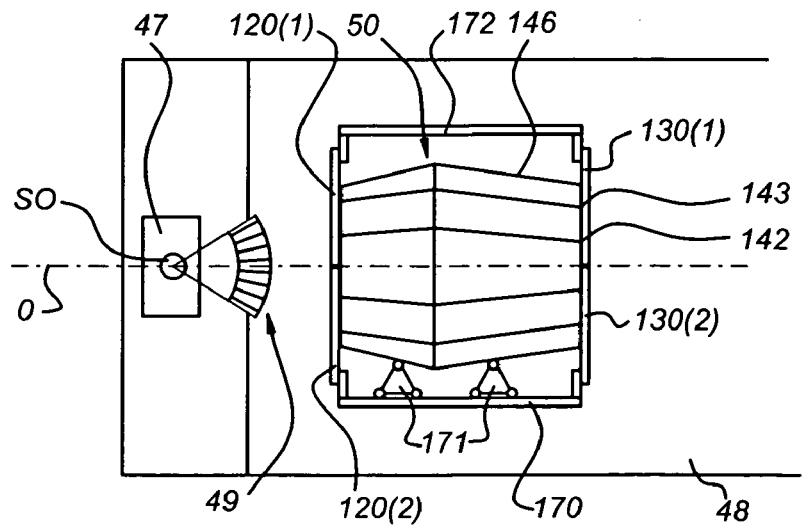

The construction of a door in this small space may be difficult, as e.g. shown in WO 2004/104707. Therefore, in another embodiment there is provided a lithographic apparatus, wherein the lithographic apparatus further includes one or more transporters configured to move the radiation collector. In this way, the radiation collector 50 can be moved, for example a few cm to the right (for example in FIGS. 9a and 9b), such that a door 120 may be closed. After the cleaning procedure, door 120 is opened and radiation collector 50 may be moved to its starting position (device manufacturing position). Referring to FIGS. 9a and 9b, a guide 171 along which the collector 50 inside a hull or between doors 120 and 130 can be moved from a position during EUV operation to a position during cleaning (FIGS. 9a and 9b, respectively) is provided. This movement allows the use of a less difficult door. To this end, one or more guides 171 or transporters, for example wheels, or a number of wheels, or a conveyor belt, a caterpillar track, a gear wheel, etc., on, for example, rails, slides, a track etc., for the radiation collector may be provided, for example moving on part of the hull 200, or on the bottom of hull 200, or on a wall of collector chamber 48. These guidings may also rest on a wall, bottom, or support element 170, which may be part of a frame. It should be appreciated that other transporters may be suitable to move the radiation collector 50. The movement of the radiation collector 50 also allows for separating the lamellar contaminant barrier 49 and the radiation collector 50 which in turn allows for cleaning of the collector 50 (included in the enclosure volume formed by the internal volume of radiation collector 50, enclosed by doors 120 and 130 and outer reflectors 146) and not cleaning elements outside the enclosure volume. Hence, in an embodiment there is also provided a method wherein the lithographic apparatus further includes a source SO and a lamellar contaminant barrier 49 between the source SO and the radiation collector 50, wherein the method further includes transporting the radiation collector 50 such that a distance between the lamellar contaminant barrier 49 and the radiation collector 50 is increased, and providing a shutter 120 to the enclosure volume between the lamellar contaminant barrier 49 and the radiation collector 50.

In an embodiment, the distance during use of the lithographic apparatus between lamellar contaminant barrier 49 and the radiation collector 50 is between about 3-10 mm, for example about 5 mm, and is increased with about at least 30 mm, for example with at least about 40 mm, for example about 50-60 mm when the shutter 120 is provided and the cleaning procedure is to be applied. Thereafter, the door 120 may be removed and the radiation collector 50 may be transported to its normal position in the exposure mode.

In an embodiment, to simplify the construction, the construction is designed and a method is applied to restrict corrosive gasses from escaping the enclosure volume without the need of an absolute leak tight construction. For example, when the pressure outside the enclosure volume is set on a higher level than inside the enclosure volume. For gaps which are not too large a relatively small overpressure is sufficient to effectively reduce the outflow of corrosive gasses to very low levels. In this way no special O-rings, special vacuum-seals, leak-tight door-closure etc. are necessary, which reduces the complexity and costs.

FIGS. 9a and 9b (and also FIG. 3) show an embodiment wherein at both ends 50a and 50b of radiation collector 50 gas barriers 120 and 130, respectively are found. These gas barriers 120 and 130 respectively, are in these embodiments doors 120 and 130, respectively. In an alternative embodiment, not depicted but similar to the embodiment schematically depicted in FIG. 7b, only one door is provided, for example door 120, with, in a variation, an inlet 2(1) for gas (see above), but no second door 130. The opening at end 50b of radiation collector 50 and a reduced pressure of the chamber including radiation collector 50 can be used as exhaust. The pressure with the enclosure volume may be selected between about 0.2 and 50 mbar, for example between about 1 and 20 mbar, and the pressure outside this enclosure volume (chamber 48) of radiation collector 50 is preferably maintained at about $10^{-6}$-1500 mbar higher, for example between about $10^{-5}$ and 1000 mbar higher than within the enclosure volume.

In this way, a large exit for pumping is provided. Further, there may be a pump present, either in this chamber or outside this chamber, connected to an inlet 2(2) which has it opening in the chamber including the radiation collector 50, such that this pump can remove gasses such as halogenides, water, etc. Pump 6(2), inlet 2(2) and gas supply 6(1) may include a number of pumps, inlets and gas supplies, respectively. Another variant is wherein a second door is provided, which is not completely closing one side of the radiation collector 50. In this way, one may adjust the desired pressure differences between the enclosure volume and the surrounding atmosphere.

Referring to FIG. 10, in a specific embodiment, there is provided a lithographic apparatus wherein the radiation collector 50 is enclosed by a circumferential hull 200 and the gas barrier(s). Hence, the method of the invention may in an embodiment further include providing a circumferential hull 200 enclosing radiation collector 50. The hull 200 at least circumferentially includes radiation collector 50, relative to the outer surface of radiation collector 50. The length of hull 200 parallel to optical axis 0 may be at least 50%, for example at least 90%, for example at least 100% of the length of the radiation collector 50, as calculated parallel to optical axis 0. A length of 100% would be the length from opening 50a to 50b, parallel to optical axis 0. It should be appreciated that the hull 200 may also be curved and is not necessarily round, as depicted in FIG. 10. Herein, the "enclosure volume" includes the volume provided by hull 200 and at one or both ends of the hull gas barriers. Further, the term "radiation collector enclosure" indicates the elements providing the enclosure volume, i.e. hull 200 and one or more gas barriers at one or more ends of the radiation collector, more precisely, at the ends of hull 200. In yet a further embodiment, these gas barriers includes shutters or doors 120 and 130. One or more inlets for gas may be provided in the hull, as indicated by pipe or inlet 2, and gas supply or pump 6, but gas may also be provided via one ore more opening in the shutters or doors 120 or 130, as shown in FIGS. 7a and 7b, or may be provided to the enclosure volume before closing the shutters or doors 120 and 130. Further, one or more outlets may be provided in the shutters or doors, or in the hull, etc. In FIG. 10, reference symbols 2 and 6 indicate schematically the presence of a gas supply and an exhaust, for example inlets, outlets, exhausts, pumps, blowers, etc.

In FIG. 10, the opened state is shown with opened half doors 120(1), 120(2) and the closed state with doors 130(1) and 130(2) respectively. These doors or valves or shutters may close in different ways, like sliding, rotating on a wheel, being included of different parts and opening and closing like a diaphragm, etc (see also above; FIG. 7a). Radiation collector 50 is then enclosed by doors 120 and 130 and a circumferential wall or hull 200. Referring to FIG. 10, enclosure volume refers here to a hull 200 including a circumferential wall (like a cylinder or a cocoon) around radiation collector 50 and having shutters 120 and 130 at both sides of radiation collector 50.

The hull 200 and/or doors 120 and/or 130 can be equipped with either or both heating elements and cooling devices to be able to operate the volume enclosed by the hull 200 at different temperatures during EUV operation, cleaning operation and maintenance. The hull 200 can be equipped with inlet ducts for reaction gasses and/or exhaust-ducts to remove gasses.

Two doors 120 and 130 at both exits 50a and 50b of this hull can be closed in order to completely close the hull 200 to separate the inside of the hull 200 from the outside of the hull 200. Several variations of doors are possible, for example including two halves which close the hull, with a sliding door, with a diaphragm type of closure, etc. The doors 120 and 130 can be used to either administer gasses needed for cleaning or they can function as an exhaust to remove the gases from the internal volume of the hull (radiation collector 50).

Referring to FIG. 10 (although this embodiment may also be included in the other embodiments as depicted in FIGS. 2-9b), optionally an axis 201 may be present, connected to lamellar contaminant barrier or foil trap 49 (not shown in this figure) (and in a variant also to lamellar contaminant barrier 149), which is used to drive a rotating lamellar contaminant barrier. Along this axis lamellar contaminant barrier 49 rotates. Hence, doors 120 and 130 have in this variant a notch for this axis 201. Axis 201 may be present in a enclosure volume or envelope, for example for protection. Either axis 201 or its enclosure volume may include sensor(s), heating and/or cooling elements or devices in order to control the temperature within hull 200, for example during a cleaning procedure. Doors 120 and 130 may also include such heating and/or cooling elements or devices. Heating elements or devices may include heatable wires, coils, channels to transport a heating liquid, etc. Cooling elements or devices may include cooling ducts, channels for transporting a cooling liquid. These heating and/or cooling elements or devices may be connected to or be in thermal contact with the one or more gas barriers, for example doors 120 and 130, hull 200 or radiation collector 50.

In yet a further embodiment, lamellar contaminant barrier 49 and lamellar contaminant barrier 149 or both include a double lamellar contaminant barrier, i.e. part of parallel lamellas 49a are rotated during use of the lithographic apparatus and part of these lamellas 49a are stationary.

FIG. 10 (and also FIG. 3) shows an embodiment wherein at both ends 50a and 50b of radiation collector 50 gas barriers 120 and 130, respectively, are found. These gas barriers 120 and 130 are in these embodiments doors 120 and 130, respectively, formed by two halves 120(1) and 120(2), respectively and 130(1) and 130(2), respectively (although other types of doors/shutters/valves may be used). In an alternative embodiment, not depicted but similar to the embodiment schematically depicted in FIG. 7b, only one door is provided, for example door 120, with a variation including an inlet 2(1) for gas (see above), but without a second door. The opening at end 50*b* of radiation collector 50 and the reduced pressure of the chamber including radiation collector 50 can be used as exhaust. In this way, a large exit for pumping is provided. Another variant is wherein a second door is provided, which is not completely closing one side of the radiation collector 50. In this way, one may adjust the desired pressure differences between the enclosure volume and the surrounding atmosphere.

By providing a halogen containing gas, a hydrogen containing gas or both, at least part of the deposition is removed from the radiation collector. The gasses may be provided via an inlet in e.g. a door (e.g. door 120), through lamellar contaminant barrier 49 and/or 149 (i.e. the space between lamellar elements 49*a* form inlets) or through inlets in a hull 200, which are connected to a gas supply (for example gas supply. 6(1) in FIGS. 7*a* and 10). Volatile gasses such as $SnH_4$, $SnBr_4$, $H_2O$, possible reaction products in the removal process, can be removed by an outlet, for example connected to door 120 or 130 respectively, through lamellar contaminant barrier 49 and/or 149 (i.e. the space between lamellar elements 49*a* also form outlets) or an outlet connected to a hull 200 (e.g. outlet 2 and pump 6 in FIG. 10). Hence, in an embodiment one or both gas barriers include an inlet, an outlet or both an inlet and an outlet, and in another embodiment, the circumferential hull 200 includes an inlet, an outlet or both an inlet and an outlet.

In yet a further embodiment, radiation collector 50 is movable within hull 200. This embodiment is a combination of the embodiment depicted in FIGS. 10 and 9*a*/9*b*, respectively. For example, hull 200 may be formed by a circumferential support including support elements 170 and 172. In this embodiment, FIGS. 9*a* and 9*b* would schematically depict a side view, wherein the top of the hull 200 is indicated with reference symbol 172, and the bottom of hull 200 is indicated with reference symbol 170.

In a variant on the embodiment as depicted in FIG. 10, guides or transporters 171 are provided outside hull 200, and not as shown in FIG. 10 (or FIG. 9*b*) inside. To this end, there may be provided small leaking holes in the hull 200 through which a connection with the collector is made with the guides or transporters 171 on the outside of the hull 200. The amount of materials and elements inside the hull 200 is thus minimized. Due to an over pressure within chamber 48 with respect to the volume enclosed by hull 200, the gasses within hull 200 are substantially kept within this volume. Hence, support elements 170 and/or 172, if present (see FIGS. 9*a* and 9*b*), may also be outside hull 200.

In an embodiment, the distance (during use of the lithographic apparatus) between lamellar contaminant barrier 49 and the radiation collector 50 is between about 3-10 mm, for example about 5 mm, and is increased with about at least 30 mm, for example with at least about 40 mm, for example about 50-60 mm when the shutter 120 is provided and the cleaning procedure is to be applied. Thereafter, the door 120 may be removed and the radiation collector 50 may be transported to its normal position in the exposure mode by moving radiation collector 50 within hull 200.

In a further embodiment, at least part of the gas supply to the radiation collector enclosure volume or at least part of components of the radiation collector enclosure volume that are involved in providing gas to this volume, for example by openings, such as gas supply 6(1), outlet 2(1), gas barrier(s) 49, 120, 130, 149, hull 200, etc. may be heated. In another embodiment, at least part of the gas supply to the radiation collector enclosure volume or at least part of components of the radiation collector enclosure volume that are involved in providing gas to this volume, for example by openings, such as gas supply 6(1), outlet 2(1), gas barrier(s) 49, 120, 130, 149, hull 200, etc. may be cooled. For example, in a variant referring to FIG. 7*a*, door 120 is heated by heating element 38, and door 130, which includes an opening for a gas exhaust 6(2), is cooled. In another variant, referring to FIGS. 7*a*/10, both doors 120 and 130 may be heated, but to the exhaust pipe 6(2), a cold trap is provided, for example at a temperature between −196 and 0° C. In yet another variant, referring to FIG. 10, both doors 120 and 130 and hull 200 are heated, but to the exhaust pipe 6(2), a cold trap is provided, for example at a temperature between −196 and 0° C. In yet another variant, referring to FIGS. 7*b* and 10, both a door 120 and/or a lamellar contaminant barrier 49, and hull 200 (FIG. 10) may be heated, but there is either provided no door 130, or one or more of an opened door 130 and a lamellar contaminant barrier 149. One or both of the latter two may be cooled. In this way, deposition of undesired materials within the mirror volume is reduced or minimized, especially on the radiation collector 50, but deposition on less sensible parts or components is promoted, in particular when the whole enclosure volume is heated, and one or more cold traps 202 are provided in the exhaust 2(2) or other elements such as lamellar contaminant barrier 149 are cooled.

In an embodiment of the present invention, the following processes are performed: cleaning with atomic hydrogen by providing hydrogen radical within the radiation collector enclosure volume, wherein $H_2$ gas is provided to the enclosure volume through one or more selected of one or more gas barriers selected from the group of barrier 49 and door 120, which gas barrier may be heated, a hull 200, which may be heated; and wherein no closed door 130 is provided, or wherein one or more selected from the group of an opened door 130 and a lamellar contaminant barrier 149 is provided, and wherein the lamellar contaminant barrier 149 may be cooled; subsequently cleaning with a halogen, wherein the gas including the halogen is provided to the enclosure volume through one or more selected of one or more gas barriers selected from the group of barrier 49 and door 120, which gas barrier may be heated, and a hull 200, which may be heated; and wherein one or more selected from the group of closed door 130 and a lamellar contaminant barrier 149 is provided, wherein the lamellar contaminant barrier 149 may be cooled.

During these processes, especially during the halogen cleaning, the gasses from the radiation collector volume are removed by an outlet or exhaust 6(2) which may be cooled, for example by a cold trap 202. The gas including the halogen may further include hydrogen for providing hydrogen radicals. Further, hull 200 may also include multi-injection points for the gas. In an alternative embodiment of this method, also during the hydrogen cleaning one or more selected from the group of closed door 130 and a lamellar contaminant barrier 149 is provided.

Hence, in an embodiment wherein the gas does not include a halogen, for example wherein cleaning is performed with hydrogen radicals, there may be only one or more gas barriers at only one end of the radiation collector, thereby providing a large exhaust at the other, not closed, end of the radiation collector 50, and in an embodiment wherein the gas includes a halogen, alone or next to hydrogen, there are at least two gas barriers, at both ends of the radiation collector 50. By providing gas barriers at both ends during the halogen cleaning, the halogens and the reaction products can be contained in the radiation collector enclosure, for example in the hull 200, and the volume surrounding the radiation collector enclosure volume may be maintained at a higher pressure than the pressure in the enclosure volume, thereby promoting containment of the halogens and the reaction products.

In an embodiment also one or more getter plates or getter masses may be provided, on which the hydrides, halogenides or halogen gasses may form deposits or attach to, which are then not detrimental to other (optical) elements anymore (see above). For example, a Ni coating or another getter material (see above) may be used to bind $I_2$. Such getter may be used as additional barrier means, e.g. arranged on the surface of the shutters 120 and/or 130 directed to the internal volume of radiation collector 50.

According to yet a further embodiment of the present invention, a cap layer may be provided to radiation collector 50, as described in U.S. patent application Ser. No. 10/956,344, and which may be used as protective layer. For example, there may be provided a cap layer as deposition to the radiation collector 50 including one or more elements selected from the group of B, C, Si, Ge and Sn, for example selected from the group of B, C, Si and Ge. The deposition is used as cap layer, for example a cap layer of about 1-20 nm, for example between about 5-10 nm. This deposition may be provided to the radiation collector 50 before use of the lithographic apparatus. In an embodiment, the use of the apparatus includes irradiating the optical element with a radiation beam, for example the use of a lithographic apparatus applying EUV radiation. During use of the lithographic apparatus, the cap layer may be partially or completely deteriorated or partially or completely removed from the radiation collector 50 due to collision of particles from the source SO, for example due to deposition of Sn and/or sputtering away of a part of the cap layer, for example by Sn or other particles from the source SO. Hence, in an embodiment, during at least part of the use of the apparatus Sn or other particles from the source, either Sn or other sources, or secondary particles release by collision of particles of the source with, for example, lithographic apparatus walls, deposits on at least part of the cap layer or removes at least part of the cap layer. Therefore, in a further embodiment, the deposition includes at least Sn, and in a variation thereon, the cap layer includes at least Sn. During use, both processes, deposition on the cap layer and removal of the cap layer, may occur, thereby providing a deteriorated cap layer. In a further embodiment, during at least part of the use of the apparatus Si deposits on at least part of the cap layer, for example due to outgassing from the resist. Hence, in an embodiment, the deposition includes at least Si, and in a variation thereon, the cap layer includes at least Si.

In order to remove the deteriorated cap layer, there is provided method including, during or after use of the apparatus, removing at least part of the cap layer from the radiation collector in a removal process including providing a $H_2$ containing gas in at least part of the apparatus; producing hydrogen radicals from $H_2$ from the $H_2$ containing gas; bringing the radiation collector with the cap layer into contact with at least part of the hydrogen radicals and reducing at least part of the cap layer, providing a halogen containing gas in at least part of the apparatus; and bringing the radiation collector with the cap layer into contact with at least part of the halogen containing gas and removing at least part of the cap layer.

In yet another embodiment of the invention, there is provided method including, during or after use of the apparatus, removing at least part of the cap layer from the radiation collector in a removal process including providing a $H_2$ and a halogen containing gas in at least part of the apparatus; producing hydrogen radicals from $H_2$ from the $H_2$ containing gas; and bringing the radiation collector with the cap layer into contact with at least part of the hydrogen radicals and the halogens in the gas and removing at least part of the cap layer.

In another embodiment of the invention, the method of the present invention may be incorporated in a method as described in U.S. patent application Ser. No. 10/956,344, including, during or after use of the apparatus, removing at least part of the cap layer from the radiation collector in a removal process including providing a $H_2$ containing gas in at least part of the apparatus; producing hydrogen radicals from $H_2$ from the $H_2$ containing gas; and bringing the radiation collector with the cap layer into contact with at least part of the hydrogen radicals and removing at least part of the cap layer.

In another embodiment of the invention, the method of the present invention may be incorporated in a method as described in U.S. patent application Ser. No. 10/956,344, including, during or after use of the apparatus, removing at least part of the cap layer from the radiation collector in a removal process including providing a halogen containing gas in at least part of the apparatus; bringing the radiation collector with the cap layer into contact with at least part of the halogen containing gas and removing at least part of the cap layer.

Not only may the cap layer at least partially be removed during or after use, a fresh cap layer, either on the radiation collector 50 or on the partially removed cap layer on the radiation collector 50, may also be provided according to a method as described in U.S. patent application Ser. No. 10/956,344. Hence, above mentioned methods may also be supplemented with a process of subsequently providing a cap layer to the radiation collector by a deposition process. In an embodiment, these methods may also be incorporated in a device manufacturing method. To this end, according to a further embodiment, the lithographic apparatus further includes at least one inlet to provide a $H_2$ containing gas and/or a halogen containing gas in at least part of the apparatus; a device to produce hydrogen radicals from $H_2$ from the $H_2$ containing gas; and optionally a device to provide a deposition as described in U.S. patent application Ser. No. 10/956,344, wherein the deposition includes one or more elements selected from the group of B, C, Si and Ge.

The methods of removing the cap layer may be performed by providing one or more gas barriers to one or both ends of the radiation collector, thereby providing a radiation collector enclosure volume; providing a gas to the radiation collector enclosure volume (as described above); and removing at least part of the cap layer.

The method of providing a cap layer may be performed by providing one or more gas barriers to one or both ends of the radiation collector, thereby providing a radiation collector enclosure volume; providing material that can deposit on the radiation collector (as described in U.S. patent application Ser. No. 10/956,344); and providing a cap layer (as described in U.S. patent application Ser. No. 10/956,344).

When closed gas barriers are used, such as shutters 120 and 130, they are removed or opened after performing the respective methods, and the lithographic apparatus can be used, whereas in case of lamellar contaminant barriers 49 and 149, respectively, they can be maintained at their position when subsequently using the lithographic apparatus. As mentioned above, lamellar contaminant barriers 49 and/or 149, respectively, may also be of the type that can be removed during use of the lithographic apparatus and arranged at one or both ends of the lithographic apparatus during cleaning. Further, combinations of shutters 120 and/or 130, respectively, and lamellar contaminant barriers 49 and 149, respectively, are also possible.

In an embodiment the radiation used in the lithographic apparatus and collected by the radiation collector includes EUV radiation having a wavelength selected from the range of 5-20 nm, for example about 13.5 nm.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, flat panel displays including liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the present invention have been described above, it should be appreciated that the present invention may be practiced otherwise than as described. For example, the present invention may take the form of a computer program containing one or more sequences of machine-readable instructions describing a method as disclosed above, or a data storage medium (e.g. semiconductor memory, magnetic or optical disk) having such a computer program stored therein. This computer program may be used to control the removal of the deposition, control the pressures, control the partial pressures, control the gas flows of the gasses, control the doors/shutters 120/130, control lamellar contaminant barriers 49/149, control transport of radiation collector 50, etc.

The descriptions above are intended to be illustrative, not limiting. Thus, it will be apparent to one skilled in the art that modifications may be made to the present invention as described without departing from the scope of the claims set out below.

The present invention is not limited to application of the lithographic apparatus or use in the lithographic apparatus as described in the embodiments. Further, the drawings usually only include the elements and features that are necessary to understand the present invention. Beyond that, the drawings of the lithographic apparatus are schematic and not on scale. The present invention is not limited to those elements, shown in the schematic drawings (e.g. the number of mirrors drawn in the schematic drawings). Further, the present invention is not confined to the lithographic apparatus described in relation to FIGS. 1 and 2. The present invention described with respect to a radiation collector may also be employed to (other) multilayer, grazing incidence mirrors or other optical elements. It should be appreciated that embodiments described above may be combined. For example, more heating elements 38 or hot filaments 110 may be present as depicted, or may be present on other places as schematically depicted in the figures. Further, gas supply and pumps, respectively, inlets and outlets, respectively, may in some cases be interchanged. For example, an inlet for providing a gas, may subsequently be used as outlet for removing a gas.

What is claimed is:

1. A method for removal of a deposition on a radiation collector of a lithographic apparatus, the method comprising:
   providing a gas to a radiation collector enclosure volume, wherein a gas barrier comprising a lamellar contaminant barrier or a shutter is disposed at each end of the radiation collector to establish the radiation collector enclosure volume, the gas selected from one or more of the group of a halogen containing gas and a hydrogen containing gas; and
   removing at least part of the deposition from the radiation collector with the gas.

2. A method according to claim 1, wherein the gas includes a $H_2$ containing gas, the method further comprising: producing hydrogen radicals from $H_2$ from the $H_2$ containing gas.

3. A method according to claim 1, wherein the gas comprises a $I_2$ containing gas.

4. A method according to claim 1, further comprising:
   providing a $H_2$ containing gas;
   producing hydrogen radicals from $H_2$ of the $H_2$ containing gas; and
   subsequently providing a halogen containing gas.

5. A method according to claim 1, wherein the gas is provided to the enclosure volume through multiple injection points.

6. A method according to claim 1, wherein the deposition comprises one or more elements selected from the group of B, C, Si, Ge and Sn and combinations thereof.

7. A method according to claim 1, further comprising: heating the enclosure volume.

8. A method according to claim 1, further comprising: providing a heating filament within the enclosure volume.

9. A method according to claim 1, further comprising: heating at least part of the enclosure volume and/or the gas.

10. A method according to claim 1, further comprising: cooling at least part of the enclosure volume and/or exhaust gas from the radiation collector enclosure volume.

11. A method according to claim 1, further comprising: providing a getter material in the enclosure volume.

12. A method according to claim 1, further comprising: providing a pressure outside the enclosure volume of 0.1-2000 mbar larger than within the enclosure volume.

13. A method according to claim 1, further comprising: providing a circumferential hull enclosing the radiation collector.

14. A method according to claim 1, wherein the radiation collector comprises a collector mirror.

15. A device manufacturing method, comprising:
   projecting a patterned beam of radiation onto a target portion of a substrate; and
   during or after the projecting, removing at least part of a deposition from a radiation collector in a removal process comprising
      providing a gas to a radiation collector enclosure volume, wherein a gas barrier comprising a lamellar contaminant barrier or a shutter is disposed at each end of the radiation collector to establish the radiation collector enclosure volume, the gas selected from one or more of the group of a halogen containing gas and a hydrogen containing gas; and removing at least part of the deposition from the radiation collector with the gas.

16. A method according to claim 15, wherein the gas comprises a $H_2$ containing gas, the method further comprising: producing hydrogen radicals from $H_2$ of the $H_2$ containing gas.

17. A method according to claim 15, wherein the gas comprises a $I_2$ containing gas.

18. A method according to claim 15, further comprising:
providing a $H_2$ containing gas;
producing hydrogen radicals from $H_2$ of the $H_2$ containing gas; and
subsequently providing a halogen containing gas.

19. A method according to claim 15, wherein the gas is provided to the enclosure volume through multiple injection points.

20. The method according to claim 15, wherein the deposition comprises one or more elements selected from the group of B, C, Si, Ge and Sn and combinations thereof.

21. A method according to claim 15, further comprising: heating the enclosure volume.

22. A method according to claim 15, further comprising: providing a heating filament within the enclosure volume.

23. A method according to claim 15, further comprising: heating at least part of the enclosure volume and/or the gas.

24. A method according to claim 15, further comprising: cooling at least part of the enclosure volume and/or exhaust gas from the enclosure volume.

25. A method according to claim 15, further comprising: providing a getter material in the enclosure volume.

26. A method according to claim 15, further comprising: providing a pressure outside the enclosure volume of 0.1-2000 mbar larger than within the enclosure volume.

27. A method according to claim 15, further comprising: providing a circumferential hull enclosing the radiation collector.

28. A method according to claim 15, wherein the radiation collector comprises a collector mirror.

29. A method for removal of a deposition on a radiation collector of a lithographic apparatus, the lithographic apparatus further including a source and a lamellar contaminant barrier between the source and the radiation collector, the method comprising:

providing a gas to a radiation collector enclosure volume, wherein a gas barrier is disposed at each end of the radiation collector to establish the radiation collector enclosure volume, the gas selected from one or more of the group of a halogen containing gas and a hydrogen containing gas;

removing at least part of the deposition from the radiation collector with the gas;

transporting the radiation collector such that a distance between the lamellar contaminant barrier and the radiation collector is increased; and providing a shutter to the enclosure volume between the lamellar contaminant barrier and the radiation collector.

30. A device manufacturing method, comprising:
projecting a patterned beam of radiation onto a target portion of a substrate; and during or after the projecting, removing at least part of a deposition from a radiation collector in a removal process comprising providing a gas to a radiation collector enclosure volume, wherein a gas barrier is disposed at each end of the radiation collector to establish the radiation collector enclosure volume, the gas selected from one or more of the group of a halogen containing gas and a hydrogen containing gas;

removing at least part of the deposition from the radiation collector with the gas;

transporting the radiation collector such that a distance between a lamellar contaminant barrier and the radiation collector is increased; and providing a shutter to the enclosure volume between the lamellar contaminant barrier and the radiation collector.

* * * * *